(12) United States Patent
Woodbury et al.

(10) Patent No.: US 10,427,125 B2
(45) Date of Patent: Oct. 1, 2019

(54) METHODS FOR PERFORMING PATTERNED CHEMISTRY

(75) Inventors: Neal Woodbury, Tempe, AZ (US); John Rajasekaran, Tempe, AZ (US); Nidhi Gupta, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 1111 days.

(21) Appl. No.: 14/116,749

(22) PCT Filed: May 4, 2012 (Under 37 CFR 1.47)

(86) PCT No.: PCT/US2012/036631
§ 371 (c)(1),
(2), (4) Date: Dec. 17, 2014

(87) PCT Pub. No.: WO2012/154594
PCT Pub. Date: Nov. 15, 2012

(65) Prior Publication Data
US 2015/0141296 A1    May 21, 2015

Related U.S. Application Data

(60) Provisional application No. 61/484,130, filed on May 9, 2011.

(51) Int. Cl.
*B82Y 30/00* (2011.01)
*B01J 19/00* (2006.01)
*C40B 50/14* (2006.01)
*G03F 7/16* (2006.01)

(52) U.S. Cl.
CPC .......... *B01J 19/0046* (2013.01); *B82Y 30/00* (2013.01); *C40B 50/14* (2013.01); *G03F 7/165* (2013.01); *B01J 2219/00317* (2013.01); *B01J 2219/00432* (2013.01); *B01J 2219/00443* (2013.01); *B01J 2219/00527* (2013.01); *B01J 2219/00585* (2013.01); *B01J 2219/00596* (2013.01); *B01J 2219/00612* (2013.01); *B01J 2219/00617* (2013.01); *B01J 2219/00621* (2013.01); *B01J 2219/00626* (2013.01); *B01J 2219/00637* (2013.01); *B01J 2219/00659* (2013.01); *B01J 2219/00662* (2013.01); *B01J 2219/00711* (2013.01); *B01J 2219/00722* (2013.01); *B01J 2219/00725* (2013.01)

(58) Field of Classification Search
None
See application file for complete search history.

(56) References Cited

U.S. PATENT DOCUMENTS

| | | | |
|---|---|---|---|
| 5,384,261 A | 1/1995 | Winkler et al. | |
| 5,424,186 A | 6/1995 | Fodor et al. | |
| 5,565,332 A | 10/1996 | Hoogenboom et al. | |
| 5,571,639 A | 11/1996 | Hubbell et al. | |
| 6,083,697 A * | 7/2000 | Beecher | B01J 19/0046 422/129 |
| 6,153,743 A | 11/2000 | Hubbell et al. | |
| 2003/0050438 A1* | 3/2003 | Montgomery | B01J 19/0046 530/334 |
| 2004/0038556 A1 | 2/2004 | French et al. | |
| 2004/0063902 A1 | 4/2004 | Miranda | |
| 2005/0156499 A1* | 7/2005 | Dinu | G02F 1/065 313/310 |
| 2007/0122841 A1 | 5/2007 | Rajasekaran et al. | |
| 2007/0122842 A1 | 5/2007 | Rajasekaran et al. | |
| 2008/0124719 A1 | 5/2008 | Chung et al. | |
| 2009/0258796 A1 | 10/2009 | Rajasekaran et al. | |
| 2010/0261205 A1 | 10/2010 | Kakuta et al. | |
| 2011/0105366 A1 | 5/2011 | Lebl et al. | |
| 2015/0217258 A1 | 8/2015 | Woodbury et al. | |

FOREIGN PATENT DOCUMENTS

| | | |
|---|---|---|
| WO | WO 97/27329 A1 | 7/1997 |
| WO | WO 2008/151146 A2 | 12/2008 |
| WO | WO-2013063133 A1 | 5/2013 |
| WO | WO-2014062981 A1 | 4/2014 |

OTHER PUBLICATIONS

SWI (Thermal Oxide Wafer sales brochure downloaded from the internet Dec. 6, 2018) (Year: 2018).*
Japanese Application No. 2012-516358 Office Action dated Jun. 16, 2015.
"U.S Appl. No. 13/379,080 Final Office Action dated Jul. 21, 2015".
Boltz, et al. Peptide microarrays for carbohydrate recognition. Analyst. Apr. 2009;134(4):650-2. doi: 10.1039/b823156g. Epub Feb. 11, 2009.
Co-pending U.S. Appl. No. 14/436,465, filed Apr. 16, 2015.
Fodor et al., Light-directed, spatially addressable parallel chemical synthesis, Science, Feb. 1991, 767-73, vol. 251, No. 4995.
Fu et al., Exploring peptide space for enzyme modulators, J. Am. Chem. Soc., Apr. 2010, 6419-6424, vol. 132, No. 18.
Fu et al., Interenzyme substrate diffusion for an enzyme cascade organized on spatially addressable DNA nanostructures, J Ani Chem Soc., Mar. 2012, 5516-9, vol. 134, No. 12.
Fu, et al. Peptide-modified surfaces for enzyme immobilization. PLoS One. Apr. 8, 2011;6(4):e18692. doi: 10.1371/journal.pone.0018692.
Greving et al., Feature-level MALDI-MS characterization of in situ-synthesized peptide microarrays, Langmuir, Feb. 2009, 1456-1459, vol. 26, No. 3.
Gupta, N., et al. Engineering a synthetic ligand for tumor necrosis factor-alpha.(2011) Bioconjugate Chemistry, vol. 22, pp. 1473-1478.
Han et al., DNA origami with complex curvatures in three-dimensional space, Science, Apr. 2011, 342-346, vol. 332, No. 6027.

(Continued)

*Primary Examiner* — Christopher M Gross
(74) *Attorney, Agent, or Firm* — Wilson Sonsini Goodrich & Rosati

(57) ABSTRACT

Provided are methods for performing patterned chemistry and arrays prepared thereby.

21 Claims, 11 Drawing Sheets

(56) References Cited

OTHER PUBLICATIONS

Hughes, et al. Immunosignaturing can detect products from molecular markers in brain cancer. PLoS One. 2012;7(7):e40201. doi: 10.1371/journal.pone.0040201. Epub Jul. 16, 2012.

Ke et al., Self-assembled water-soluble nucleic acid probe tiles for label-free RNA hybridization assays, Science, Jan. 2008, 180-183, vol. 319, No. 5860.

Legutki, et al. A general method for characterization of humoral immunity induced by a vaccine or infection. Vaccine. Jun. 17, 2010;28(28):4529-37. doi: 10.1016/j.vaccine.2010.04.061. Epub May 5, 2010.

Lund, et al., Molecular robots guided by prescriptive landscapes, Nature, May 2010, 206-210, vol. 465, No. 7295.

Northen et al., Combinatorial screening of biomimetic protein affinity materials, Adv Mater., Oct. 2008, 4691-4697, vol. 20, No. 24.

Price et al., On silico peptide microarrays for high-resolution mapping of antibody epitopes and diverse protein-protein interactions, Nat Med, Sep. 2012, 1434-40, vol. 18, No. 9.

Restrepo, et al. Application of immunosignatures to the assessment of Alzheimer's disease. Ann Neurol. Aug. 2011;70(2):286-95. doi: 10.1002/ana.22405.

Shan et al., Imaging local electrochemical current via surface plasmon resonance, Science, Mar. 2010, 1363—66, vol. 327, No. 5871.

Sharma et al., Control of self-assembly of DNA tubules through integration of gold nanoparticles, Science, Jan. 2009, 112-116, vol. 323, No. 5910.

Singh-Gasson et al., Maskless fabrication of light-directed oligonucleotide microarrays using a digital micromirror array, Nat Biotechnol, Oct. 1999, 974-978, vol. 17, No. 10.

Takulapalli et al., Electrical detection of amine ligation to a metalloporphyrin via a hybrid SOI-MOSFET, J. Am. Chem. Soc., Jan. 2008, 2226-2233, vol. 130, No. 7.

Wilk et al., Integrated electrodes on a silicon based ion channel measurement platform, Biosensors and Bioelectronics, Sep. 2007, 183-190, vol. 23, No. 2.

Williams et al., Creating protein affinity reagents by combining peptide ligands on synthetic DNA scaffolds, J. Am Chem Soc., Dec. 2009, 17233-17241, vol. 131, No. 47.

Zhang et al., Reversible oxygen gas sensor based on electrochemiluminescence., Chemical Communications, May 2010, 3333-3335, vol. 46, No. 19.

International search report dated Dec. 20, 2013 for PCT/US2013/065541.

International search report and written opinion dated Oct. 22, 2012 for PCT/US2012/036631.

Moller, et al. DNA probes on chip surfaces studied by scanning force microscopy using specific binding of colloidal gold. Nucleic Acids Res. Oct. 15, 2000;28(20):E91.

U.S. Appl. No. 14/436,465 Final Office Action dated Sep. 20, 2017.

U.S. Appl. No. 14/436,465 Advisory Office Action dated Dec. 4, 2017.

U.S. Appl. No. 14/436,465 Restriction Requirement dated Dec. 6, 2017.

* cited by examiner

METHODS FOR PERFORMING PATTERNED CHEMISTRY

This application is filed pursuant to 35 U.S.C. § 371 as a United States National Phase Application of International Application Ser. No. PCT/US12/36631, filed May 4, 2012, which claims the benefit under 35 U.S.C. § 119(e) of U.S. Provisional Application No. 61/484,130, filed May 9, 2011 the contents of which is incorporated by reference in its entirety.

Provided are methods for performing patterned chemistry and arrays prepared thereby.

The ability of photolithographic approaches to generate locally strong acids, or, potentially, strong bases, in a region defined by patterned exposure to light using a photoresist with appropriate acid or base generation chemistry has been discussed. The generated acid or base serves to remove an acid-labile or base-labile blocking group from a reactive site on a molecule, which will allow the reactive site to be further modified. Common groups that can be unmasked in this way include hydroxyl groups and amine groups used during the synthesis of molecules such as nucleic acids and peptides. However, such photolithographic approaches typically utilize very thin, very films of reagents on a surface that can be produced reproducibly by spin coating, spraying or rolling. Those approaches may not be amenable to the use of solvents as it would be difficult to spin coat, spray or roll a solvent on a flat smooth surface and expect it to remain even. Either the solvent would spread very thin and evaporate, or it would simply spin off the surface (in the case of spin coating) due to centripetal force, or it would create a thin layer that would puddle when the spinning, spraying or rolling process stopped. Such difficulties would result in decreased yield and/or purity.

Provided is a method of making an array of molecules, comprising:

providing a substrate having a surface wherein the surface has a plurality of features, each of the features being defined by a perimeter and at least some of the features comprising a first plurality of active sites, applying a first chemical reaction mixture onto the surface such that the first chemical reaction mixture is evenly distributed across the plurality of active sites, wherein the first chemical reaction mixture comprises a first molecule having a first functional group capable of attaching to the active site, a second functional group capable of forming a covalent bond and a protecting group capping the second functional group, whereby the first molecule is coupled to the first plurality of active sites.

Also provided is an array prepared by any of the methods described herein.

Also provided is a composition comprising a polymer matrix and a first molecule wherein the first molecule comprises a first functional group capable of forming a covalent bond and a second functional group capable of forming a covalent bond optionally capped with a protecting group.

Figure 1:
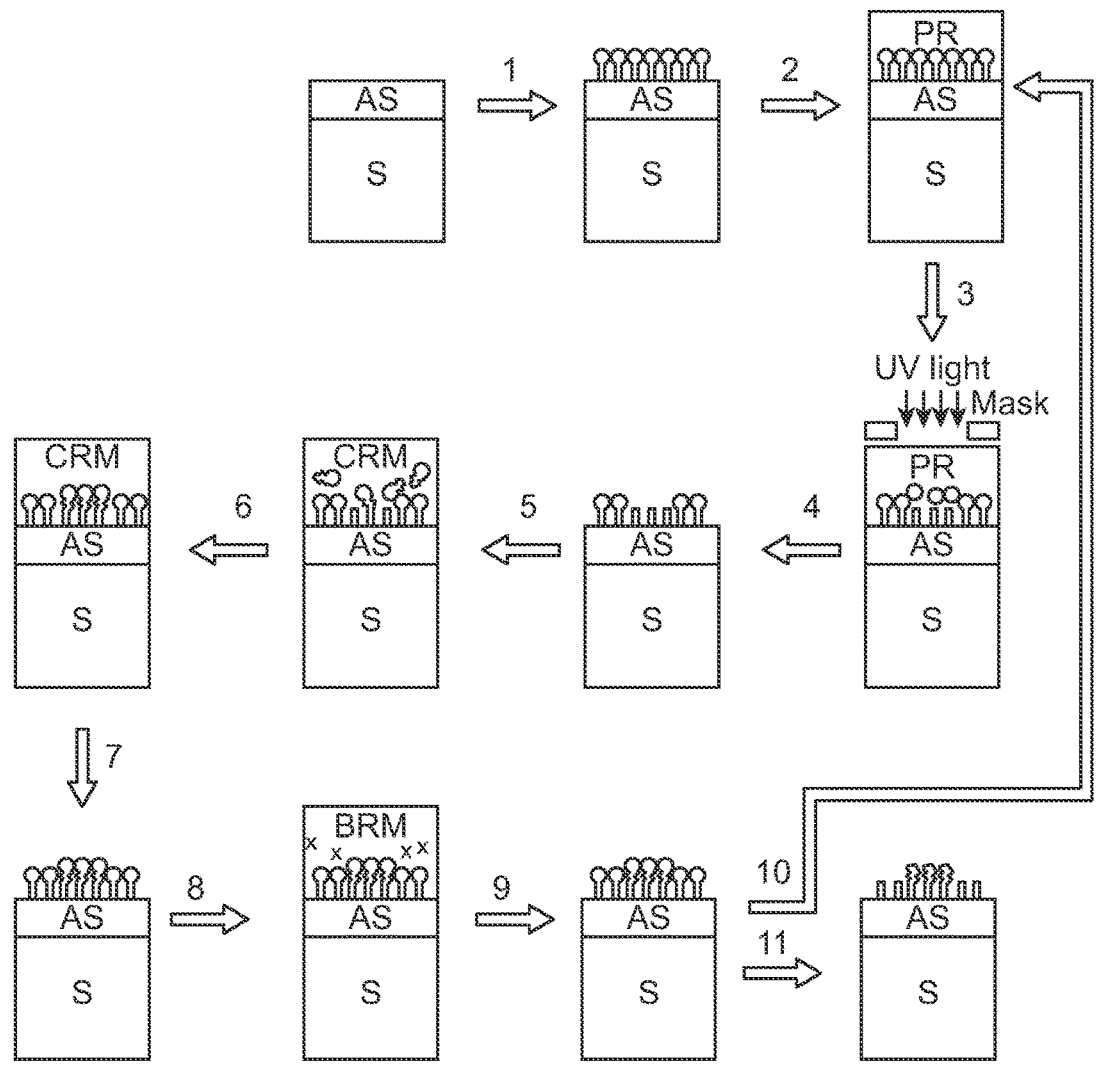
FIG. 1 illustrates a method for performing pattern chemistry using a thin layer chemical reaction.

As used in the present specification, the following words, phrases and symbols are generally intended to have the meanings as set forth below, except to the extent that the context in which they are used indicates otherwise. The following abbreviations and terms have the indicated meanings throughout:

As used in the specification and claims, the singular forms "a", "an" and "the" include plural references unless the context clearly dictates otherwise. For example, the term "an array" may include a plurality of arrays unless the context clearly dictates otherwise.

An "array" refers to an intentionally created collection of molecules attached to or fabricated on a substrate in which the identity or source of a group of molecules is known based on its location on the array. The molecules housed on the array and within a feature of an array can be identical to or different from each other.

A "peptide" is a polymer of amino acids, amino acid mimics or derivatives, and/or unnatural amino acids which are generally joined together through amide (peptide) bonds. A peptide can alternatively be referred to as a polypeptide. Peptides contain two or more amino acid monomers, and often more than 50 amino acid monomers (building blocks). The amino acids can be any amino acids, including $\alpha$, $\beta$ or $\omega$-amino acids and modified amino acids. When the amino acids are a-amino acids, either the L-optical isomer or the D-optical isomer may be used. In general, an amino acid contains an amine group, a carboxylic group, and an R group. The R group can be a group found on a natural amino acid or a group that is similar in size to a natural amino acid R group. Additionally, unnatural amino acids, for example, phenylglycine, homoarginine, aminobutyric acid, aminohexanoic acid, aminoisobutyric acid, butylglycine, citrulline, cyclohexylalanine, diaminopropionic acid, hydroxyproline, norleucine, norvaline, ornithine, penicillamine, pyroglutamic acid, sarcosine, and thienylalanine are also contemplated. These and other natural and unnatural amino acids are available from, for example, EMD Biosciences, Inc., San Diego, Calif.

The term "nucleotide" includes deoxynucleotides and analogs thereof. These analogs are those molecules having some structural features in common with a naturally occurring nucleotide such that when incorporated into a polynucleotide sequence, they allow hybridization with a complementary polynucleotide in solution. Typically, these analogs are derived from naturally occurring nucleotides by replacing and/or modifying the base, the ribose or the phosphodiester moiety. The changes can be tailor-made to stabilize or destabilize hybrid formation, or to enhance the specificity of hybridization with a complementary polynucleotide sequence as desired, or to enhance stability of the polynucleotide.

The term "polynucleotide" or "polynucleic acid" as used herein refers to a polymeric form of nucleotides of any length, either ribonucleotides or deoxyribonucleotides, that comprise purine and pyrimidine bases, or other natural, chemically or biochemically modified, non-natural, or derivatized nucleotide bases. Polynucleotides include sequences of deoxyribopolynucleotide (DNA), ribopolynucleotide (RNA), or DNA copies of ribopolynucleotide (cDNA) which may be isolated from natural sources, recombinantly produced, or artificially synthesized. A further example of a polynucleotide may be polyamide polynucleotide (PNA). The polynucleotides and nucleic acids may exist as single-stranded or double-stranded. The backbone of the polynucleotide can comprise sugars and phosphate groups, as may typically be found in RNA or DNA, or modified or substituted sugar or phosphate groups. A polynucleotide may comprise modified nucleotides, such as methylated nucleotides and nucleotide analogs. The sequence of nucleotides may be interrupted by non-nucleotide components. The polymers made of nucleotides such as nucleic acids, polynucleotides and polynucleotides may also be referred to herein as "nucleotide polymers.

An "oligonucleotide" is a polynucleotide having 2 to 20 nucleotides. Analogs also include protected and/or modified monomers as are conventionally used in polynucleotide synthesis. As one of skill in the art is well aware, polynucleotide synthesis uses a variety of base-protected nucleoside derivatives in which one or more of the nitrogen atoms of the purine and pyrimidine moiety are protected by groups such as dimethoxytrityl, benzyl, tert-butyl, isobutyl and the like. For instance, structural groups are optionally added to the ribose or base of a nucleoside for incorporation into a polynucleotide, such as a methyl, propyl or allyl group at the 2'-O position on the ribose, or a fluoro group which substitutes for the 2'-O group, or a bromo group on the ribonucleoside base. 2'-O-methyloligoribonucleotides (2'-O-MeORNs) have a higher affinity for complementary polynucleotides (especially RNA) than their unmodified counterparts. Alternatively, deazapurines and deazapyrimidines in which one or more N atoms of the purine or pyrimidine heterocyclic ring are replaced by C atoms can also be used.

The phosphodiester linkage or "sugar-phosphate backbone" of the polynucleotide can also be substituted or modified, for instance with methyl phosphonates, O-methyl phosphates or phosphorothioates. Another example of a polynucleotide comprising such modified linkages includes "peptide polynucleotides" in which a polyamide backbone is attached to polynucleotide bases, or modified polynucleotide bases. Peptide polynucleotides which comprise a polyamide backbone and the bases found in naturally occurring nucleotides are commercially available.

Nucleotides with modified bases can also be used. Some examples of base modifications include 2-aminoadenine, 5-methylcytosine, 5-(propyn-1-yl)cytosine, 5-(propyn-1-yl) uracil, 5-bromouracil, 5-bromocytosine, hydroxymethylcytosine, methyluracil, hydroxymethyluracil, and dihydroxypentyluracil which can be incorporated into polynucleotides in order to modify binding affinity for complementary polynucleotides.

Groups can also be linked to various positions on the nucleoside sugar ring or on the purine or pyrimidine rings which may stabilize the duplex by electrostatic interactions with the negatively charged phosphate backbone, or through interactions in the major and minor groves. For example, adenosine and guanosine nucleotides can be substituted at the N2 position with an imidazolyl propyl group, increasing duplex stability. Universal base analogues such as 3-nitropyrrole and 5-nitroindole can also be included. A variety of modified polynucleotides are described in the literature.

A "protecting group" is a group which is bound to a molecule and designed to block a reactive site in a molecule, but may be removed upon exposure to an activator or a deprotecting reagent. Deprotecting reagents include, for example, acids and bases. Protecting groups can be bound to a monomer, a polymer, a linker molecule or a monomer, or polymer, or a linker molecule attached to a solid support to protect a reactive functionality on the monomer, polymer, or linker molecule. Protective groups that may be used include all acid and base labile protecting groups. For example, peptide amine groups may be protected by t-butoxycarbonyl (t-BOC or BOC) or benzyloxycarbonyl (CBZ), both of which are acid labile, or by 9-fluorenylmethoxycarbonyl (FMOC), which is base labile. Additional protecting groups that may be used include acid labile groups for protecting amino moieties: tert-amyloxycarbonyl, adamantyloxycarbonyl, 1-methylcyclobutyloxycarbonyl, 2-(p-biphenyl)proxy (2)oxycarbonyl, 2-(pphenylazophenylyl) propyl(2)oxycarbonyl,.alpha.,.alpha.dimethyl-3,5-dimethyloxybenzyloxycarbonyl, 2-phenylpropyl(2)oxycarbonyl, 4-methyloxybenzyloxycarbonyl, furfuryloxycarbonyl, triphenylmethyl(trityl), p-toluenesulfenylaminocarbonyl, dimethylphosphinothioyl, diphenylphosphinothioyl, 2-benzoyl-I-methylvinyl, o-nitrophenylsulfenyl, and I-naphthylidene; as base labile groups for protecting amino moieties: 9-fluorenylmethyloxycarbonyl, methylsulfonylethyloxycarbonyl, and 5-benzisoazolylmethyleneoxycarbonyl; as groups for protecting amino moieties that are labile when reduced: dithiasuccinoyl, p-toluene sulfonyl, and piperidino-oxycarbonyl; as groups for protecting amino moieties that are labile when oxidized: (ethylthio) carbonyl; as groups for protecting amino moieties that are labile to miscellaneous reagents, the appropriate agent is listed in parenthesis after the group: phthaloyl(hydrazine), trifluoroacetyl(piperidine), and chloroacetyl(2-aminothiophenol); acid labile groups for protecting carboxylic acids: tert-butyl ester; acid labile groups for protecting hydroxyl groups: dimethyltrityl.

A "linker" or "linker molecule" is a molecule inserted into the growing polymer that does not necessarily convey functionality to the resulting peptide, such as molecular recognition functionality, but instead elongates the distance between the substrate surface and the peptide functionality to enhance the exposure of the peptide functionality on the surface of the substrate. In some embodiments, the linker is about 4 to about 40 atoms long to provide exposure. The linker molecules may be, for example, aryl acetylene, ethylene glycol oligomers containing 2-10 monomer units (PEGs), diamines, diacids, amino acids, among others, and combinations thereof. Examples of diamines include ethylene diamine and diamino propane. Alternatively, the linkers may be the same molecule type as that being synthesized (i.e., nascent polymers), such as polypeptides and polymers of amino acid derivatives such as for example, amino hexanoic acids. A person skilled in the art would know how to design appropriate linkers.

"Puddling" refers to the breakdown of a continuous liquid film on a surface into distinct small drops or the creation of regions where the continuous liquid film is broken.

"Solid support", "support", and "substrate" refer to a material or group of materials having a rigid or semi-rigid surface or surfaces. In some embodiments, at least one surface of the solid support will be substantially flat, although in some embodiments, it may be desirable to physically separate synthesis regions for different molecules with, for example, wells, raised regions, pins, etched trenches, or the like. In some embodiments, the solid support may be porous. Substrate materials include, for example, silicon, biocompatible polymers such as, for example poly (methyl methacrylate) (PMMA) and polydimethylsiloxane (PDMS), glass, SiO, (such as, for example, a thermal oxide silicon wafer such as that used by the semiconductor industry), quartz, silicon nitride, functionalized glass, gold, platinum, and aluminum. Functionalized surfaces include for example, amino-functionalized glass, carboxy functionalized glass, and hydroxy functionalized glass. Additionally, a substrate may optionally be coated with one or more layers to provide a surface for molecular attachment or functionalization, increased or decreased reactivity, binding detection, or other specialized application. Substrate materials and or layer(s) may be porous or non-porous. For example, a substrate may be comprised of porous silicon. Additionally, the substrate may be a silicon wafer or chip such as those used in the semiconductor device fabrication industry. In the case of a wafer or chip, a plurality of arrays may be synthesized on the wafer. In some embodiments, the substrate is chosen from glass, silicon and silicon having a silicon oxide layer. A person skilled in the art would know how to select an appropriate support material.

A "photoresist" or "photosensitive layer" refers to a substance, which upon radiation, generates a deprotecting reagent (e.g., a photogenerated acid or base). In some embodiments, the photoresist comprises a polymer, a solvent, and a radiation-activated deprotecting reagent (also referred to as deprotecting reagent precursor).

In some embodiments, the polymer is chosen from poly (methyl methacrylate) (PMMA), poly-(methyl isopropenyl ketone) (PMPIK), poly-(butene-1-sulfone) (PBS), poly(trifluoroethyl chloroacrylate) (TFECA), copolymer-(α-cyano ethyl acrylate-α-amido ethyl acrylate (COP), and poly-(2-methyl pentene-1-sulfone). In some embodiments, the solvent is chosen from propylene glycol methyl ether acetate (PGMEA), ethyl lactate, and ethoxyethyl acetate. In some embodiment, the photosensitive layer may comprise any commercially available photoresist, for example a commercial available 248 nm photoresist, such as UV172 or P5107 or JSR micro photoresist KrF M22Y3 or KrF 146G6.

In some embodiments, the photoresist comprises radiation-activated catalysts (RAC), or more specifically photo activated catalysts (PACs). Photosensitive compounds act as catalysts to chemically alter synthesis intermediates linked to a support to promote formation of polymer sequences. Alternatively, RACs can activate an autocatalytic compound which chemically alters the synthesis intermediate in a manner to allow the synthesis intermediate to chemically combine with a later added synthesis intermediate or other compound.

In some embodiments, the deprotecting reagent is a photogenerated acid or base.

In some embodiments, the deprotecting reagent precursor is selected from sulfonium salts, halonium salts, and polonium salts. Sulfonium ions are positive ions, R3 S+, where R is, for example, a hydrogen or alkyl group, such as methyl, phenyl, or other aryl group. Nonlimiting examples include trimethyl sulfonium iodide and triaryl sulfonium hexafluroantimonatate (TASSbF$_6$). In general, halonium ions are bivalent halogens, R2X+, where R is a hydrogen or an alkyl group, such as methyl, phenyl, or other aryl group, and X is a halogen atom. The halonium ion may be linear or cyclic. Polonium salt refers to a halonium salt where the halogen is iodine, the compound R2 I+Y−, where Y is an anion, for example, a nitrate, chloride, or bromide. Nonlimiting examples include diphenyliodonium chloride and diphenyliodonium nitrate.

Photogenerated bases include amines and diamines having photolabile protecting groups.

In some embodiments, the photoresists further comprises a photosensitizer. In general, a photosensitizer absorbs radiation and interacts with the RAC, such as PAC, through one or more mechanisms, including, energy transfer from the photosensitizer to the cleavage reagent precursor, thereby expanding the range of wavelengths of radiation that can be used to initiate the desired catalyst-generating reaction. As such, the photosensitizer can be a radiation sensitizer, which is any material that shifts the wavelengths of radiation required to initiate a desired reaction. Thus, the photosensitizer allows the use of radiation energies other than those at which the absorbance of the radiation-activated catalyst is non-negligible. In some embodiments, the photosensitizer is selected from benzophenones, thioxanthenones, anthraquinone, fluorenone, acetophenone, and perylene.

In some embodiments, the photoresist may further comprise an enhancer that is ester labile to acid catalyzed thermolytic cleavage, itself produces an acid, enhancing the removal of protective groups. The enhancer can be any material that amplifies a radiation-initiated chemical signal so as to increase the effective quantum yield of the radiation. Enhancers include, but are not limited to, catalytic materials. The use of an enhancer in radiation-assisted chemical processes is termed chemical amplification. Chemical amplification has many benefits. Nonlimiting examples of the benefit of chemical amplification include the ability to decrease the time and intensity of irradiation required to cause a desired chemical reaction. Chemical amplification also improves the spatial resolution and contrast in patterned arrays formed using this technique. The enhancer is a compound or molecule that can be added to a photoresist in addition to a radiation-activated catalyst. An enhancer can by activated by the catalyst produced by the radiation-induced decomposition of the RAC and autocatalyticly reacts to further (above that generated from the radiation-activated catalyst) generate catalyst concentration capable of removing protecting groups. For example, in the case of an acid-generating RAC, the catalytic enhancer can be activated by acid and or acid and heat and autocatalyticly reacts to form further catalytic acid, that is, its decomposition increases the catalytic acid concentration. The acid produced by the catalytic enhancer removes protecting groups from the growing polymer chain. In some embodiments, the photosensitive layer further comprises a polymer and a solvent.

In some embodiments, the mass concentration of the polymer in the photosensitive layer formulations may range between about 5% and about 50%. In some embodiments, the mass concentration of a photosensitizer may range between about 5% and 20%. In some embodiments, the mass concentration of the deprotecting reagent precursor may range between about 1% and about 10%. In some embodiments, the balance comprises a suitable solvent, such as, propylene glycol methyl ether acetate (PGMEA), ethyl lactate, and/or ethoxyethyl acetate. The solvent used in fabricating the photoresist may be selected depending on the particular polymer, photosensitizer, and deprotecting reagent precursor that are selected. For example, when the polymer used in the photoresist is PMMA, the photosensitizer is isopropylthioxanthenone, and the deprotecting reagent precursor is diphenyliodonium chloride, PGMEA or ethyl lactate may be used as the solvent.

Provided is a method of making an array of molecules, comprising:

providing a substrate having a surface wherein the surface has a plurality of features, each of the features being defined by a perimeter and at least some of the features comprising a first plurality of active sites, applying a first chemical reaction mixture onto the surface such that the first chemical reaction mixture is evenly distributed across the first plurality of active sites, wherein the first chemical reaction mixture comprises a first molecule having a first functional group capable of attaching to the active site, a second functional group capable of forming a covalent bond and a protecting group capping the second functional group, whereby the first molecule is coupled to the first plurality of active sites.

In some embodiments, the method further comprises
selectively forming a second plurality of active sites in at least some of the features, applying a second chemical reaction mixture onto the surface such that the second chemical reaction mixture is evenly distributed across the second plurality of active sites, wherein the second chemical reaction mixture comprises a second molecule having a first functional group capable of attaching to the active site, a second functional group capable of forming a covalent bond and a protecting group capping the second functional group, whereby the second molecule is coupled to the second plurality of active sites.

In some embodiments, selectively forming a second plurality of active sites in at least some of the features comprises depositing a photosensitive layer over the substrate wherein the photosensitive layer comprises a deprotecting reagent precursor that upon activation generates a deprotecting reagent capable of causing the removal of the protecting group, activating at least a portion of the photosensitive layer; and removing the photosensitive layer.

In some embodiments, activating at least a portion of the photosensitive layer comprises exposing at least a portion of the photosensitive layer to radiation. In some embodiments, a broad spectrum lamp or laser is used to supply the radiation. In some embodiments, the radiation comprises UV radiation, including, in some embodiments, deep ultraviolet wavelengths. In some embodiments, the radiation has a wavelength ranging from about 190 nm to about 700 nm. In some embodiments, the radiation has a wavelength of about 193 nm or about 248 nm. In some embodiments, the radiation has a wavelength of about 248 nm. In some embodiments, the radiation has a wavelength of about 360 nm.

In some embodiments, prior to depositing the photosensitive layer over the surface, the method comprises depositing a bottom reflection protection layer over the substrate.

In some embodiments, prior to removing the photosensitive layer, the method further comprises heating the substrate to about 50 to 200° C.

In some embodiments, the step of coupling the first molecule to the first plurality of active sites proceeds with greater than 90% efficiency.

In some embodiments, the step of coupling the second molecule to the second plurality of active sites proceeds with greater than 90% efficiency.

In some embodiments, the selectively forming a second plurality of active sites in at least some of the features results in removal of step of greater than 90% of the protecting groups in the areas exposed to the radiation.

The chemical reaction mixture may be applied onto the surface using any number of methods, including spin coating or other deposition methods wherein the chemical reaction mixture is deposited uniformly onto a substrate in a thin layer such that the chemical reaction mixture does not puddle. In some embodiments, the chemical reaction mixture is applied using a method such as rolling, spraying, drop casting, slot die coating, or blade coating. In some embodiments, spin coating is used.

In some embodiments, after the chemical reaction mixture is applied onto the surface, the method further comprises heating the substrate. In some embodiments, heating the substrate comprises heating the substrate with a hot plate.

The chemical reaction mixture comprises a first molecule having a first functional group capable of attaching to the substrate, a second functional group capable of forming a covalent bond and a protecting group capping the second functional group.

In some embodiments, the chemical reaction mixture further comprises a polymer matrix. In some embodiments, the polymer matrix is incorporated into the chemical reaction mixture in an amount sufficient to facilitate spreading and/or to decrease puddling.

The polymer matrix may comprise any suitable polymers, including but not limited to, poly(methyl methacrylate) (PMMA), poly(choloromethyl methacrylate)polystyrene, polycarbonate, polyethylene glycol, poly-(methyl isopropenyl ketone) (PMPIK), poly-(butene-1-sulfone) (PBS), poly-(trifluoroethyl chloroacrylate) (TFECA), copolymer-(α-cyano ethyl acrylate-α-amido ethyl acrylate (COP), poly-(2-methyl pentene-1-sulfone), and mixtures thereof.

In some embodiments, the polymer matrix comprises at least one polymer selected from poly(methyl methacrylate), polystyrene, polycarbonate, polyethylene glycol, poly(choloromethyl methacrylate), and mixtures thereof. In some embodiments, the polymer matrix comprises poly(methyl methacrylate) and polystyrene. In some embodiments, the polymer matrix comprises poly(methyl methacrylate) and polystyrene in a ratio of about 1:2. In some embodiments, the polymer matrix comprises poly(methyl methacrylate), polystyrene, polycarbonate or polyethylene glycol.

In some embodiments, the polymer matrix has a total polymer content of about 10%. In some embodiments, the polymer matrix has a total polymer content of about 2.5%.

In some embodiments, the chemical reaction mixture comprises a viscous solvent. In some embodiments, the viscous solvent is incorporated into the chemical reaction mixture in an amount sufficient to facilitate spreading and/or to decrease puddling.

In some embodiments, the chemical reaction mixture further comprises a solvent. In some embodiments, the solvent is N-methyl-2-pyrrolidone. In some embodiments, the solvent is acetonitrile.

In some embodiments, the first molecule is an amino acid having an amino group that is optionally capped with a protecting group. In some embodiments, the first molecule is an amino acid having an fluorenylmethyloxycarbonyl group capping the amino group. In some embodiments, the first molecule is an amino acid having a t-butoxycarbonyl group capping the amino group. In some other embodiments, the first molecule is an amino acid having an optionally substituted trityl group, such as a dimethoxytrityl group, capping the amino group.

In some embodiments, the concentration of the first molecule in the first chemical reaction mixture is about 1%.

In some embodiments, the chemical reaction mixture further comprises DIC.

In some embodiments, the chemical reaction mixture further comprises a base chosen from DIEA and 4,4'-trimethylenedipiperidine.

In some embodiments, wherein the chemical reaction mixture further comprises isopropyl-9H-trioxanthen-9-one.

In some embodiments, the chemical reaction mixture further comprises bis(4-tert-butylphenyl)iodonium triflate.

In some embodiments, the chemical reaction mixture further comprises 2-nitrobenzyl p-nitrophenylcarbonate.

In some embodiments, the chemical reaction mixture further comprises 1-hydroxybenzotriazole hydrate.

In some embodiments, the chemical reaction mixture further comprises DIEA or other base coupling reagents. In some embodiments, the chemical reaction mixture comprises 10% polymer matrix, such as PMMA and polystyrene mixed in a portion of 1:2, 1% amino acid, DIC (diisopropylcarbodiimide), and DIEA dissolved in a solvent of NMP. In some embodiments, the chemical reaction mixture comprises 2.5% polymer matrix, such as PMMA, 1% amino acid, DIC (diisopropylcarbodiimide), HBOt and DIEA dissolved in a solvent of NMP. In some embodiments, the chemical reaction mixture comprises 2.5% polymer matrix, such as PMMA, 1% amino acid, DIC (diisopropylcarbodiimide), HBOt dissolved in a solvent of NMP, followed by a separate neutralization step using 5% DIEA in DMF.

In some embodiments, the first molecule is a nucleotide. In some embodiments, the first molecule is a nucleotide having a dimethoxy trityl group capping the second functional group. In some embodiments, the chemical reaction mixture comprises 2.5% PMMA, 1% nucleotide monomer and 0.5M tetrazole in acetonitrile.

In some embodiments, the first molecule may be a linker molecule. In some embodiments, a linker should be about 4 to about 40 atoms long to provide sufficient exposure of the biopolymer functionality. The linker molecules may be, for example but not limited to, aryl acetylene, polyethyleneglycols or ethylene glycol oligomers containing 2-10 monomer units (PEGs), nascent polypeptides, diamines, diacids, peptides, amino acids, among others, and combinations thereof. Examples of diamines include ethylene diamine and diamino propane. Alternatively, the linkers may be the same molecule type as that being synthesized (i.e., nascent polymers), such as polypeptides and polymers of amino acid derivatives such as for example, amino hexanoic acids.

In some embodiments, the perimeter comprises a physical modification of the substrate. In some embodiments, the physical modification is designed so that the surface interacts with the chemical reaction mixture, facilitating the distribution of the chemical reaction mixture across active sites on the surface. In some embodiments, the chemical reaction mixture is designed so that it interacts with the physical modifications of the surface so that the chemical reaction mixture maintains a distribution over the active sites on the surface. In some embodiments, the physical modification is designed so as to reduce the lateral diffusion of the deprotecting reagent. In some embodiments, the physical modification is designed to define and/or preserve the edges of the features.

In some embodiments, the physical modification comprises a perimeter material that is deposited onto the surface such that the perimeter material outlines the features where the different chemical species will be produced on the surface. In some embodiments, the perimeter material reduces background signal in the interstitial spaces. In some embodiments, the perimeter material provides a reference signal. In some embodiments, the perimeter material is a metal. In some embodiments, the metal is a metal is chosen from gold, chrome, and tin. In some embodiments, the perimeter comprises a series of pillars or hair-like structures or a series of particles.

In some embodiments, when the perimeter material is a metal, the perimeter is formed by a process comprising depositing a metal film onto a surface of a substrate;

forming a patterned photosensitive layer on the film;

etching the film in areas not covered by the photosensitive layer to form a plurality of features that are defined by the perimeter; and removing the patterned photosensitive layer.

In some embodiments, prior to depositing the metal film onto the surface of the substrate, the substrate has a thermal oxide film on the surface. In some embodiments, prior to depositing the metal film on the surface of the substrate, the substrate has a thermal oxide film on both surfaces.

In some embodiments, the perimeter comprises a chemical modification of the substrate. In some embodiments, a portion of at least some of the features also comprises a chemical modification.

In some embodiments, the chemical modification comprises synthesizing or affixing to the surface certain molecules having affinity for the chemical reaction mixture, or a component thereof, such as a solvent.

In some embodiments, the chemical modification is uniform throughout the feature and/or perimeter. In some embodiments, the chemical modification occurs in a patterned fashion throughout the feature and/or perimeter.

In some embodiments, the molecules are synthesized or affixed to optimize interaction between the substrate and the chemical reaction mixture or a component thereof, such as the solvent. For example, in some embodiments, molecules are placed on the surface so that the range of intermolecular interactions, under the forces and conditions that the surface is exposed to, appropriately matches the distribution of the chemical reaction mixture, or a component thereof, such as the solvent. In some embodiments, the chemical modification comprises a polymer or nanotubes. In some embodiments, the chemical modification comprises deposition of a material, such as a metal.

Also provided is an array comprising a substrate having a surface where the surface has a plurality of features, each of the features being defined by a perimeter, and a plurality of compounds of known structure attached to the substrate surface, wherein the structure of compounds in a first feature of the array is different from the structure of compounds in a second feature of the array. In general, an array can have any number of features, and the number of features contained in an array may be selected to address such considerations as, for example, experimental objectives, information-gathering objectives, and cost effectiveness, which is not limited to a particular size.

The features may have any convenient shape, for example, the features of the array may be circular, square, rectangular, elliptical, or wedge-shaped. Multiple copies of a compound will typically be located within each of the features. The number of copies of a compound can be in the thousands to the millions within each feature. In some embodiments, the area occupied by a feature is not more than about 10,000 $\mu m^2$, for example not more than about 2000 $\mu m^2$ such as about 1000 $\mu m^2$. In some embodiments, the area occupied by a feature is about 100 $\mu m^2$. In some embodiments, the area occupied by a feature is about 10 $\mu m^2$.

In some embodiments, the area occupied by a feature of the array is less than about 1 $\mu m^2$. In some embodiments, the area occupied by a feature of the array is less than about 0.04 $\mu m^2$.

In some embodiments, an array may comprise 100 to 1,000,000,000 features, for example 1,000 to 500,000 features such as 10,000 to 100,000 features. In some embodiments, an array is a 20×20 matrix having 400 features, 64×32 matrix having 2,048 features, or a 640×320 array having 204,800 features. In some embodiments, the array comprises 1,000 to 100,000 features.

In some embodiments, the array may have a density of about 10,000 to about 1,000,000 features per $cm^2$ such as about 100,000 features per $cm^2$.

In some embodiments, the structure of compounds in a first feature of the array is the same from the structure of compounds in a second feature of the array. In some embodiments, the structure of compounds in a first feature of the array is different from the structure of compounds in a second feature of the array.

In some embodiments, the protecting group of the first molecule is different from the protecting group of the second molecule. In some embodiments, the protecting group of the first molecule is the same as the protecting group of the second molecule. In some embodiments, the same deprotecting reagent precursors are used in different cycles of the synthesis. In some embodiments, different deprotecting reagent precursors are used in different cycles of the synthesis.

In some embodiments, the deprotecting and coupling reactions are performed in separate steps in each cycle. In some embodiments, the deprotecting and coupling reactions in the same cycle are performed in a single step. In some embodiments, a deprotecting-coupling mixture is applied to the surface of the substrate to facilitate the deprotecting step and coupling step simultaneously. In some embodiments, the deprotecting-coupling mixture comprises an acid producing photoresist and base-labile protected amino acids compounds along with coupling reagents. In some embodiments, the deprotecting-coupling mixture comprises a base producing photoresist and an acid-labile protected amino acids compounds along with coupling reagents.

In some embodiments, the deprotecting-coupling mixture of one cycle comprises an acid producing photoresist and base-labile protected amino acids compounds along with coupling reagents, while the deprotecting-coupling mixture used in the following cycle comprises a base producing photoresist and an acid-labile protected amino acid compounds along with coupling reagents, or vise versa. In these embodiments, acid or base producing lithography steps are performed in alternative to synthesis the microarray.

In some embodiments, the array is prepared by any of the methods described herein.

FIG. 1 illustrates an exemplary embodiment. In some embodiments, see, e.g., step 1, FIG. 1, providing a substrate having a surface wherein the surface has a plurality of features, each of the features being defined by a perimeter and at least some of the features comprising a first plurality of active site comprises reacting an active surface (designated "AS") of a substrate (designated "S") with a compound that provides the density and type of active sites needed to initiate the synthesis.

The active surface comprises a material that allows direct chemical modification resulting in the active sites that will be needed to initiate patterned chemical synthesis. In some embodiments, the active surface is silicon oxide on a silicon substrate. In some embodiments, the active surface is gold. In some embodiments, the active surface is glass.

In some embodiments, the active surface is reacted with aminopropyltriethoxysilane (APTES) to create active sites comprising primary amines. In some embodiments, the density of polymers on the surface is modulated by mixing a functionalizable silane (e.g., APTES) with a non-functional silane (i.e., a silane with no silyl functional group, such as propyltrialkoxy silane).

In some embodiments, the active surface is reacted using methods known in the art to generate active sites chosen from hydroxyls, carboxylic acids, aldehydes, and thiol groups.

In some embodiments, the active sites are blocked directly by a protecting group that is acid or base labile.

In some embodiments, the active sites are coupled to a linker or a molecule that forms the first element of the chemical synthesis. In some embodiments, the linker or molecule is terminated with an acid or base labile protecting group.

In some embodiments, the linker is a protected glycine. In some embodiments, the coupling reaction between the protected glycine and the derivatized surface can be accomplished in a solution of a coupling reagent. Any suitable coupling reagents may be used, for example, carbodiimides, phosphonium-based coupling reagents, aminium-based coupling reagents and others coupling reagents such as carbonyldiimidazole. For example, in some embodiments, the coupling reagent comprises 2-(1H-7-Azabenzotriazol-1-yl)-1,1,3,3-tetramethyl uronium hexafluorophosphate methanaminium (HATU). In some embodiments, the coupling regent comprises carboxyl group activators such as 1-hydroxybenzotriazole (HOBt) and diisopropylcarbodiimide (DIC) in N-methyl pyrrolidone (NMP).

In some embodiments, the linker is a phosphoramidite monomer with a 5' hydroxyl group protected by an acid labile dimethoxy trityl (DMT) group.

In FIG. 1, the protecting group is designated with a dark circle and the lines attached directly to the active surface represent the first section of the chemical synthesized in that region (e.g., the first component in a molecule or a linker segment).

In some embodiments, e.g., in Step 2 of FIG. 1, a photosensitive layer is deposited on the substrate wherein the photosensitive layer contains a deprotecting reagent precursor that upon activation generates a deprotecting reagent (e.g., acid or base) capable of causing the removal of the protecting group is applied.

In some embodiments, the deprotecting reagent results from the direct radiation-induced decomposition of or chemical transformation of a deprotecting reagent precursor. In some embodiments, generation of the deprotecting reagent occurs through the absorption of radiation by a photosensitizer followed by reaction of the photosensitizer with the deprotecting reagent precursor, energy transfer from the photosensitizer to a cleavage reagent precursor, or a combination of two or more different mechanisms.

In some embodiments, the photosensitive layer does not contain a catalytic enhancer.

Any method known in the art of semiconductor fabrication may be used to for depositing the photoresist solution. For example, the spin coating method may be used in which the support is spun typically at speeds between about 1,000 and about 5,000 revolutions per minute for about 15 to about 60 seconds. In some embodiments, the resulting wet photoresist layer has a thickness ranging between about 0.1 µm to about 2.5 µm.

In some embodiments, after the photosensitive layer is deposited on the substrate, the substrate is heated.

In some embodiments, e.g., in Step 3 of FIG. 1, radiation, e.g., ultraviolet (UV) light or deep ultraviolet (DUV) light, is applied to the surface in a pattern. In some embodiments, the radiation is projected through a mask that defines the pattern of projection onto the surface. The pattern of the mask is chosen so that some regions of the substrate surface can be selectively activated. In some embodiments, the radiation is projected from a mask. In some embodiments, the mask is a fixed physical material, such as chrome on glass) that allows light through at some points and not others. In some embodiments, the mask is a mask defined by a programmable patterned light source (such as found in a computer projector) to change the pattern of light passing through it or reflecting from it. In some embodiments, devices other than a physical mask, for example a micromirror or other source capable of projecting a pattern image, may be used for creating a pattern in the photoresist.

As a result of the application of the radiation, acid or base, depending on the nature of the photosensitive layer, is generated in the areas exposed to the radiation and the protecting groups are released. The chemistry of the process will depend on the type of protecting groups and on the type of deprotecting reagents that are generated in the photoresist upon radiation exposure. For example, if the protecting group is t-BOC, acid cleavage can be used. For example, if the protecting group is dimethoxy trityl (DMT), acid cleavage can be used. Acids may be generated in the photoresist, for example, through the exposure of sulfonium or halonium salts to radiation. If the protecting group is FMOC, for example, then base cleavage can be used. Cleavage can be accomplished through the reaction of a photogenerated amine or diamine through a decarboxylation process.

In some embodiments, the substrate is heated after exposure to the radiation.

In some embodiments, e.g., in Step 4 of FIG. 1, the photosensitive layer is removed and with it the released protecting groups. Methods for removal of photosensitive layer from a surface are well known to those skilled in the art and include for example, washing with acetone or NMP or another suitable solvent for a period of time, for example 5-20 seconds, such as about 10 seconds.

In Step 5 of FIG. 1, the chemical reaction mixture (designated as "CRM" in FIG. 1) which comprises the chemical reagents required for the patterned chemical reaction in that particular step of the synthesis, is evenly spread onto the surface. That first molecule is designated by the zig-zag lines with the protecting group "ball" capping the second functional group.

In Step 6 of FIG. 1, a chemical reaction occurs. In some embodiments, the reaction occurs at elevated temperature. In some embodiments, the substrate is heated, for example by baking the substrate at about 85 to about 105° C., for example about 90 to about 95° C. for a period of time, for example about 1 to about 5 minutes such as about 2 minutes. In some embodiments, the chemical reaction mixture does not puddle during the incubation time of the chemical reaction.

In Step 7 of FIG. 1, the chemical reaction mixture, including unreacted reagents, certain side products, and/or impurities, is removed from the surface using methods known to those skilled in the art. In some embodiments, the surface is washed with NMP a certain period of time, for example 5-20 seconds, such as about 10 seconds.

In Step 8 of FIG. 1, an optional blocking reaction mixture or capping mixture (designated as "BRM") is added. The blocking reaction mixture comprises chemical reagents (designated with small x's) for blocking any remaining active sites. In some embodiments, the blocking reaction mixture comprise a capping reagent, for example but not limited to acetic anhydride, n-acetylimidizole, isopropenyl formate, fluorescamine, 3-nitrophthalic anhydride or 3-sulfoproponic anhydride. In some embodiments, the substrate is heated, for example by baking the substrate at about 65 to about 95° C., for example about 70 to about 80° C. such as about 75° C. for a period of time, for example about 1 to about 5 minutes such as about 2 minutes.

In some embodiments, the blocking reaction mixture further comprises a polymer matrix. In some embodiments, the polymer matrix is selected from PMMA or Polystyrene or polycarbonate, or polyethyleneglycol or PCMMA.

In some embodiments, the blocking reaction mixture further comprises at least one chemical reagent chosen from 1-hydroxybenzotriazole (HOBO, DIC, and DIEA.

In some embodiments, the blocking reaction mixture further comprises a solvent such as NMP.

In some embodiments, the blocking reaction mixture comprises acetic anhydride and 1-methylimidazole in NMP.

In Step 9 of FIG. 1, the blocking reaction mix is removed from the surface using methods well known to those skilled in the art. In some embodiments, the surface is washed with a solvent such as NMP for a period of time, for example 5-20 seconds, such as about 10 seconds.

In some embodiments, the process cycles so that additional chemical reactions may be performed. Thus, in Step 10 of FIG. 1, photosensitive layer is again added to the surface as described in Step 2 of FIG. 1 above. In some embodiments, in this second cycle, the chemical reaction mixture is the same as the chemical reaction mixture used in the first cycle. In some embodiments, in this second cycle, the chemical reaction mixture is different from the chemical reaction mixture used in the first cycle.

When the chemical synthesis is completed, after one or more cycles of the process of FIG. 1, the surface is exposed to a chemical mixture that removes all remaining blocking groups as shown in Step 11 of FIG. 1. In some embodiments, any protecting groups on the compounds are also removed. In some embodiments, Step 11 may involve multiple steps with several solutions to remove different blocking groups, depending on the types of blocking groups that have been used.

In some embodiments, the process is repeated to form polymers on the substrate surface. Through the selection of different mask configurations during the deprotecting step, polymers comprising different sequences may be formed in different features on the surface.

In the case where the building blocks are amino acids, peptides having the same or different known sequences are formed in known features on the surface of the substrate. In general, polymers containing from about 2 to about 50 mers (polymeric units) can be created. In some embodiments, peptides having a length of about 6 to about 20 amino acids are created.

In the case where the building blocks are nucleotides, oligonucleotides having the same or different known sequences are formed in known features on the surface of the substrate. In some embodiments, oligonucleotides containing from about 2 to about 50 mers (polymeric units) can be created. In some embodiments, oligonucleotides having a length of about 6 to about 20 nucleotides are created.

Figure 2:
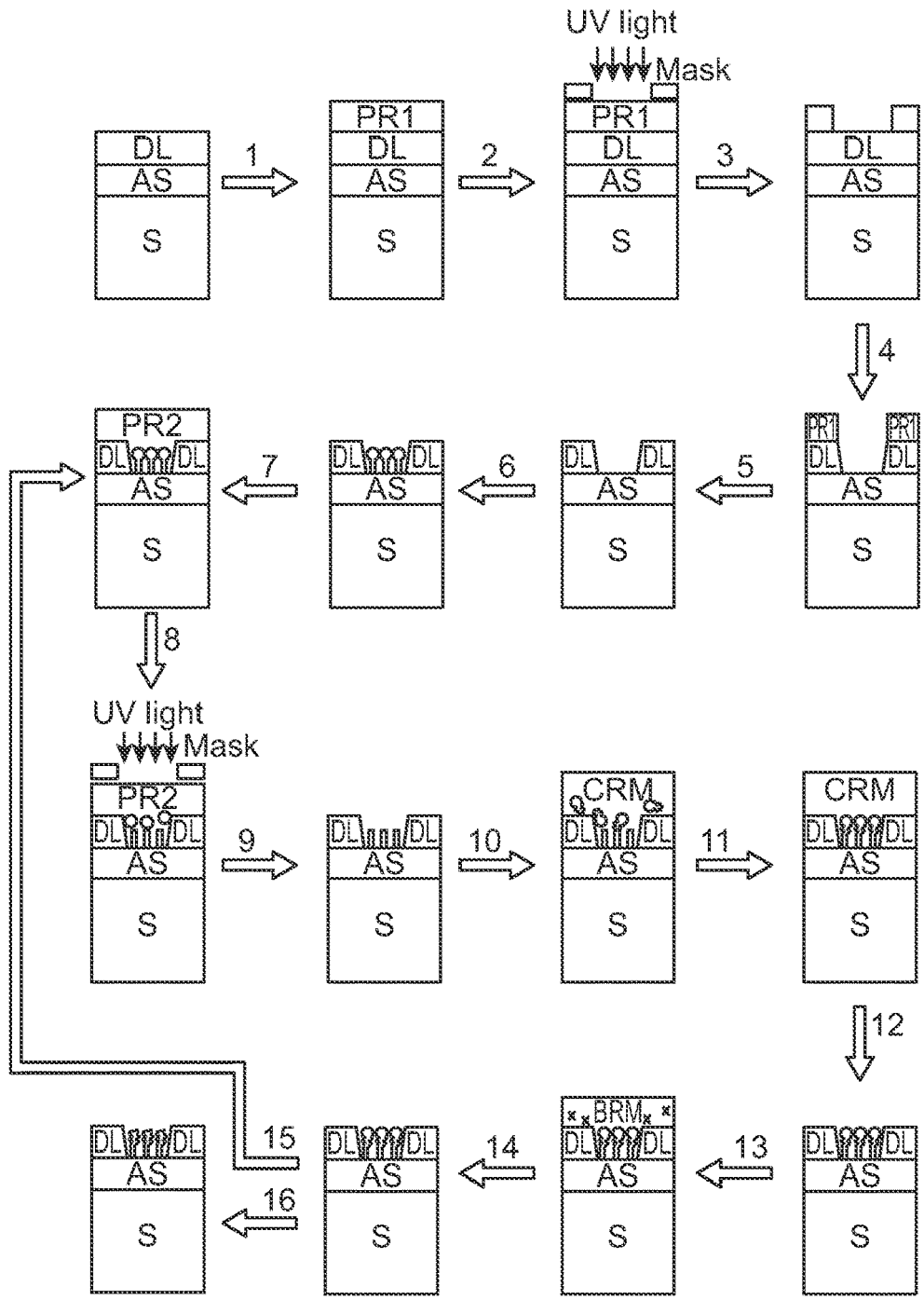
FIG. 2 illustrates a method for performing pattern chemistry using a surface modified by deposition and etching.

FIG. 2 illustrates an exemplary embodiment when the surface has been modified by deposition and etching to provide a perimeter comprising a physical modification of the surface. FIG. 2 begins with a substrate that has an active surface and a layer of material deposited (designated as "deposition layer" or "DL") on that active surface. The deposition layer comprises a material that can be deposited on the active surface and then etched to create a pattern. The deposition layer interacts with the chemical reaction mixture and/or the blocking reaction mixture such that the chemical reaction mixture and/or the blocking reaction mixture, respectively, forms a thin film on the substrate.

To initiate the process, the surface of a substrate is prepared as shown in the first five steps of FIG. 2. This process is well known to those familiar with the art and can be performed in a number of variations (for example, either a negative or positive photosensitive layer could be used, which determines how the masks are patterned). In some embodiments, the perimeter material is chrome and the deposition layer is chrome etched in a specific pattern. Many examples of patterned etching of materials on surface exist in the literature and are well known to those skilled in the art.

In some embodiments, for example, as shown in Step 1 of FIG. 2, a first photosensitive film (designated as "PR1") is applied onto the deposition layer. In Step 2 of FIG. 2, the photosensitive film is selectively exposed to UV radiation using a mask. In Step 3 of FIG. 2, a pattern of the photosensitive film is formed. In Step 4 of FIG. 2, the chromium film is etched using the photosensitive layer pattern as a mask (i.e., etching the chromium film in areas not covered by the photosensitive layer pattern), forming a chromium perimeter. Further, the remaining photosensitive layer pattern can be removed.

In some embodiments, the chromium perimeter may be formed by a lift-off method, in which a photoresist pattern is formed on the substrate first, followed by forming a chromium film and a lift-off process. The photomask use may be practiced according to standard techniques and materials used in the semiconductor fabrication industry. For example, the photomask may be a transparent pane, such as a quartz pane, having an emulsion or metal film on a surface creating the mask pattern. Suitable metals include chromium. The pattern of the mask is chosen so that the portion of the substrate surface on which to form biopolymers is not covered by the chromium pattern.

Steps 6 to 16 of FIG. 2 can be implemented using the techniques described with regard to Steps 1 to 9 of FIG. 1.

Figure 3:
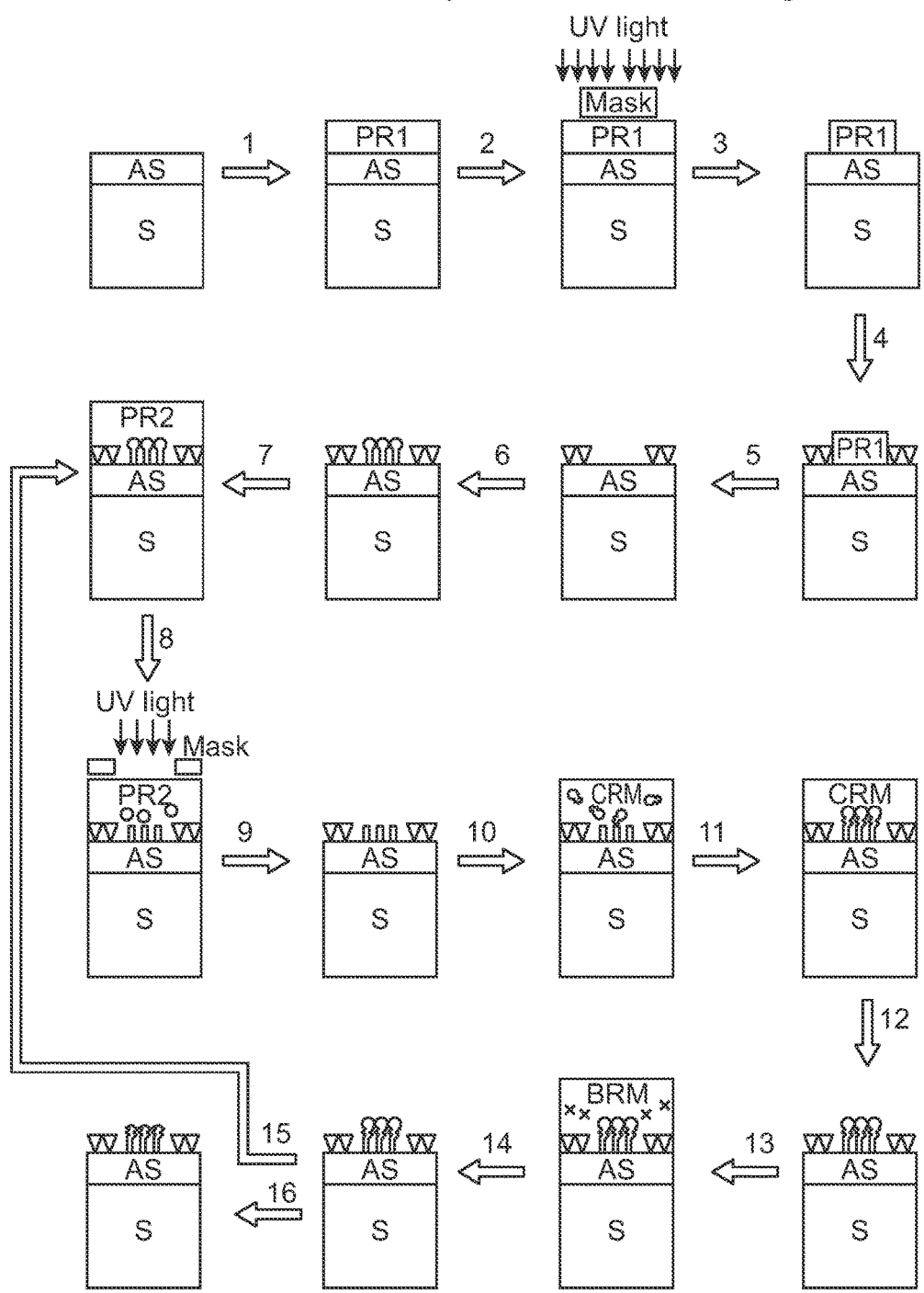
FIG. 3 illustrates a method for performing pattern chemistry using a surface modified by initial chemical patterning.

FIG. 3 illustrates an exemplary embodiment for performing pattern chemistry using a chemically modified surface to maintain and promote a reaction layer. In FIG. 3, as compared to FIG. 2, a patterned chemical reaction is used rather than a deposition layer.

FIG. 3 starts with a substrate that has an active surface. To initiate the process, the surface of a substrate is prepared as shown in the first five steps of FIG. 3. A photosensitive layer is layered on the active surface (step 1) and exposed to patterned light (step 2). In regions where the iterative chemistry is not to take place, the photosensitive layer is removed (step 3) and the active surface is available for reaction. In some embodiments, the photosensitive layer generates an acid or base which removes a blocking group, allowing chemical modification of specific regions of the surface to take place. Finally the photosensitive layer is stripped (step 5). Beyond this, the process follows closely the process of FIG. 2, described above.

For example, a protected amine can be applied to the entire surface (e.g., APTES with a Boc protecting group.) The photosensitive layer is used to specifically remove the Boc group in a pattern, such as a grid. This region is then reacted with an appropriate compound to modify it (step 4). In some embodiments, the appropriate compound may be a hydrophobic group such as an alkane, in some embodiments attached via an ester linkage. In some embodiments, the appropriate compound may be a hydrophilic group such as a carboxylic acid. In some embodiments, the appropriate compound may be aromatic group, such as a phenyl group. In some embodiments, the appropriate compound may be a polymer formed on the surface through a surface initiated polymerization reaction.

As described above, the patterned modification is designed to change the interaction between the chemical reaction mixture and the surface to result in a chemical reaction across the reactive features. One could use the same chemistry for this step as in step 6, but one could also use a very different chemical reaction.

The following examples are offered by way of illustration only and are not intended to be limiting of the full scope and spirit of the invention.

EXAMPLES

The chemical reagents used herein are all available commercially, e.g., from Aldrich Chemical Co., Milwaukee, Wis., USA. Otherwise their preparation is facile and known to one of ordinary skill in the art, or it is referenced or described herein.

Example I

Silicon wafers (8", obtained from Toppan, University Wafers or Addison Engineering) are used as starting samples. A 2.4 micron thermal oxide coating is present on both sides of the wafers.

A 200 nm chromium film is deposited onto one side of the wafers by sputtering a chromium target. A commercial KrF laser 248 nm photoresist is spin coated over the chromium film at 2500 RPM by a TEL ACT8 coater module, followed by a prebake at a vendor specified temperatures.

The photoresist coated wafers are then exposed to a 248 nm radiation in NSR S203 Nikon scanner (or a KrF scanner) with a mask purchased from Toppan. Six microarray patterns are included in this mask.

The exposed wafer is then post-baked at vendor specified temperature for a fixed time, followed by a development step carried out in TEL ACT8 developer module using NMD-3 purchased from Tokyo Ohkakogyo Ltd.

The chromium film is then wet etched using chromium etchant (e.g., CR-14 from Cyantek corporation or other chromium etchants from Trancene corporation), using the developed photoresist pattern as a mask. The remaining photoresist pattern is then stripped off, using Nano strip purchased from Cyantek Corporation.

The wafers are then treated by 3-aminopropyltriethoxysilane (APTES), obtained from Sigma-Aldrich, to derivatize the thermal oxide surface uncovered by etching the chromium pattern, using a method described in Möller, R. Andrea et., al., W. *DNA probes on chip surfaces studied by scanning force microscopy using specific binding of colloidal gold*. Nucleic Acids Research 28, 20, 91 (2000), which is incorporated herein by its entirety.

A t-Boc protected polyethelene glycol with carboxyl terminus on the other end is used as a linker molecule and coupled to the amine group on surface that results from the derivatization treatment. In another experiment, 4,4'-dimethoxylrityl (DMT)-hexacthyleneglycol-(2-cyanoethyl-N,N-diisopropyl)phosphoramidite purchased from ChemGenes Corp., is used as the linker molecule.

A amino acid coupling method is used for coupling the carboxyl group of the t-boc protected polyethelene glycol to the amine group on surface, resulting a t-boc protected polyethelene glycol terminated surface, ready for a high density solid phase synthesis of biopolymers.

Example II

Twenty amino acid coupling mixtures are prepared by mixing an inert polymer (e.g., PMMA, Polystyrene, polycarbonate, polyethylene glycol, poly(chloromethyl methacrylate), or combinations thereof) with each of distinct twenty L amino acids or D amino acids. NMP (N-Methyl-2-pyrrolidone) is used as a solvent. The amino acids are provided by AnaSpec/AAPPTec.

The amino acid coupling mixtures are prepared to have a composition of (1) 10% polymer of PMMA and PS mixed in a portion of 1:2 and (2) 1% amino acid, (3) DIC (diisopropylcarbodiimide) purchased from Advanced Chemtech, and (4) DIEA (propylethylamine) purchased from AnaSpec dissolved in a solvent of NMP purchased from J.T. Baker.

A fluorescein coupling mixture having a similar composition (by simply replacing the amino acids with carboxyfluorescein molecules in the above-described coupling mixture) is also prepared.

A photoresist is spin coated onto the wafer having a t-boc protected polyethelene glycol terminated surface prepared in Example I. The photoresist film is then exposed to pattern of 248 nm light projected through a mask in a Deep UV tool to deprotect the t-boc sites in selected features of the microarrays on the wafer.

An amino acid coupling mixture is coated onto the substrate using a spin coater module to form a film having a thickness of about 500 nm. The wafer is then baked in a hotplate for 2 minutes at 90° C. and then cooled in a cool plate for 30 seconds. In some experiments, DIEA is added to the coupling mixtures to combine the neutralization and coupling of amino acids in a single step. This technique reduces the total time needed for the synthesis by removing the step of neutralization from the process, and also significantly improves coupling efficiency especially when the peptide chain is longer than 5 amino acids.

The amino acid coupling mixture is then removed from the wafer by NMP and Acetone followed by DI water washing.

The steps of t-boc deprotection and amino acid coupling can then be repeated multiple times to complete the synthesis of peptides onto the substrate.

Example III

First, 200 nm photoresist is coated onto the wafers prepared in Example I by a Photoresist Coat Module 10. In this example, ACT TEL8 A, which includes two coater modules, two cleaner modules, five hot plates and three chill plates, is used. Particularly, the coating process is handled by the coater module. The coating process takes about 70 seconds.

Next, the wafers are delivered to hot plates for pre-baking at 85° C. for 90 seconds followed by cooling down on chill plate at 23° C. for 30 seconds.

The wafers are then sent to NSR S203 Nikon scanner, a photo-exposure module, for patterned exposure to 248 nm radiation. The time spent to conduct enhanced global wafer alignment and exposure to each wafer is about four minutes in total.

Next, the wafers are sent back to the Photoresist Coat Module for post exposure bake (PEB) at 85° C. for 90 seconds. The photoresist is then removed by dispensing acetone and IPA on the wafers for about 30 seconds. The time spent to conduct the post exposure bake and photoresist strip off is about 3 minutes and 25 seconds in total.

Further, the wafers are transferred to ACT TEL8 B, a Biochemistry Track Module 30, which is a modified ACT TEL8 A to have four amino acid coater modules rather than two cleaner modules and two coater modules. Each amino acid coater modules may have five nozzles for delivering five different amino acid coupling mixtures.

First, the wafers are washed with NMP (purchased from J.T. Baker) for 10 seconds. Next, a pre-prepared amino acid coupling mixture is dispensed onto the wafers while the wafers are spun for 15 seconds. The wafers are then placed on a hot plate at 95° C. for 2 minutes, followed by a cooling down at 23° C. for 30 seconds. The coupling mixture is then removed by acetone and IPA. The wafers are then rinsed by NMP for 10 seconds. The steps of neutralization and amino acid coupling took 3.5 minutes in total. In some embodiments, the coupling and the neutralization may be performed in a single step, for example when DIEA is used as the coupling reagent.

The wafers are then transferred back to the Photoresist Coat Module 10 for the steps of capping and cleaning.

The wafers are coated with acetic anhydride (purchased from J.T. Baker) in an NMP solution while spun for 15 seconds. They are then sent to a hot plate for a bake at 75° C. for 90 seconds. The capping mixture is then stripped off by acetone and IPA. The steps of capping and cleaning take 5.5 minutes in total.

The above-described process for adding each amino acid to the surface takes about 30 minutes in total. Such a process may be repeated as necessary to add other amino acids thereby forming peptides.

Example IV

Four polymeric solutions of DMT (dimethoxy trityl) protected nucleotides are prepared as follows.

Four nucleotide coupling mixtures are prepared by mixing an inert polymer (e.g., PMMA, Polystyrene, polycarbonate, polyethylene glycol, poly(chloromethyl methacrylate), or combinations thereof) with each of four distinct nucleotide monomers. The nucleotide monomers are purchased from ChemGenes Corporation. The coupling mixtures are prepared to have a composition of (1) 2.5% PMMA, (2) 1% nucleotide monomer, and (3) 0.5M Tetrazole dissolved in dry acetonitrile.

A fluorescein phosphoramidite coupling mixture having a similar composition (by simply replacing the nucleotide monomers with fluorescein molecules in the above-described coupling mixture) is also prepared.

A capping mixture is prepared by mixing 50% acetic anhydride or phenoxyacetic anhydride and 50% NMP/PMMA (poly methyl methacrylate) polymeric pulp.

An oxidizing solution is prepared by dissolving 0.1 M Iodine in lutidine/THF/water with a ratio of 10:40:1. All reagents and solvents are obtained from ChemGenes Corporation.

The wafer having a t-Boc protected polyethelene glycol terminated surface prepared in Example I is provided, and a 200 nm photoresist layer is spin coated onto the wafer by dispensing the photoresist for 8 seconds at 1 cc/s with the wafer spun at a speed of 2000 rpm for 20 seconds in a TEL coater module. A soft bake is performed to remove the excess solvent by heating the wafer on a hot plate at 85° C. for 90 seconds.

The photoresist film is then exposed (using an appropriate mask and/or projection optics) in a 248 nm Deep UV tool to deprotect the t-Boc sites in selected features of the microarrays on the wafer.

After a 90 second post exposure bake at 85° C., the resist is stripped off with acetone and IPA.

Next, a nucleotide coupling mixture is coated onto the substrate in the regular spin coater module to form a film having a thickness of 500 nm. The wafer is baked on a hotplate for 2 minutes at 90° C. and then cooled in a cool plate for 30 seconds.

Next, another 200 nm photoresist layer is spin coated onto the wafer by dispensing the photoresist for 8 seconds at 1 cc/s with the wafer spun at a speed of 2000 rpm for 20 seconds in a TEL coater module. A soft bake is performed to remove the excess solvent by heating the wafer on a hot plate at 85° C. for 90 seconds.

The wafer is exposed at 60 mj/cm$^2$ in a NSR Nikon 5203 Scanner. This exposure deprotects the DMT protected nucleotide. Time for alignment and exposure takes about 4 minutes. The wafer is transferred to the TEL coater for post exposure delay (without any post bake).

The polymeric solution of the next nucleotide monomer is coated on the wafer by spinning it on a TEL track in a coater module. The polymeric solution is dispensed for 15 seconds at a spin speed of 2000 rpm. The wafer is sent for a bake in hot plate for 2 minutes at 95° C. Then it is cooled for 30 seconds down to 23° C.

The capping solution is prepared and dispensed onto the wafer. The wafer is baked at 75° C. for 90 seconds, followed by oxidation of the wafer is oxidized by dispensing an oxidizing solution onto the wafer with spinning for 30 seconds in the TEL coater module. The polymeric coupling solution is washed away by dispensing acetone and IPA.

The above-described process may also be performed to synthesize the oligonucleotides onto multiple wafers simultaneously. The nucleotide coater modules may have less nozzles than amino acid coater modules because there are only four different nucleotide coupling mixtures to deliver for synthesizing DNA molecules. The total time for deprotection, coupling, capping and oxidation for one oligonucleotide monomer is about 15 minutes. Specifically, the photoresist coating and deprotection steps takes about 9 minutes in the deprotection module and the coupling, capping and oxidation steps takes about 6 minutes.

Such a process may be repeated multiple times to add other nucleotides to the surface to form the oligonucleotides.

Example V

In some embodiments, a bottom reflection protection (BRP) & acid amplifier (AA) layer may be formed over the substrate, prior to the step of forming the photosensitive layer. The BRP & AA layers can protect the biomolecular film from the high energy photon and secondary electron, avoiding degradation of surface biomolecules during the radiation step. In some embodiments, the concentration of deprotection acid generated during the deprotection step may be controlled by changing the acid amplifier concentration in the BRP & AA layers.

In this example, 5 wt % PMMA (poly methyl methacrylate) is dissolved in either chlorobenzene or anisole solvent to make BRP & AA layer reflecting 248 nm radiation. 5 wt % PMMA or 8 wt % PHOST (poly p-hydroxystyrene) polymer is dissolved in chlorobenzene and NMP (N-Methyl-2-pyrrolidone) respectively to obtain a BRP & AA layer reflecting 193 nm radiation. 2 wt % TPD (tosylate protected diols) and/or 3 wt % CSPD (camphor sulfonate pinane diols) are used as acid amplifier.

98% deprotection efficiency may be obtained when a combination of JSR micro photoresist KrF M22Y3 (a 248 nm photoresist) and 0.1 micron BRP&AA layer with 2 wt % TPD is used.

When JSR micro photoresist ArF AR1682J (193 nm photoresist) is used as the photosensitive layer, 3 wt % CSPD mixed with 5 wt % PMMA is used as the BRP&AA layer. In this example, the thickness of the layers increases to about 0.3 micron.

In another example, DOW 248 nm commercial photoresist UV 172 is used. The acid generation is controlled by varying the exposure energy with a fixed post bake temperature of 110° C. for 90 seconds. About 98% deprotection efficiency may be obtained when an exposure energy of 23 mj/cm$^2$ or higher is used. Post bake temperature and exposure energy can also be modified to achieve the desired deprotection efficiency.

Example VI

The photosensitive layer is prepared by dissolving the polymers PMMA and PS in portion 1:2 with total polymer at 10%, IT (Isopropyl-9H-trioxanthen-9-one) at 5% and Iodo PAG (Bis(4-tert-butylphenyl)iodonium triflate) at 5% in PGMEA. PGMEA may be purchased from Sumitomo Chemical. ITX may be obtained from Sigma Aldrich Inc. Iodo PAG may be obtained from Hampford Research Inc.

The photosensitive layer is deposited on a wafer by spin-coating at 2000 rpm for 30 second. The wafer is subsequently baked at 85° C. for 90 seconds, resulting in a 0.2 micron thick photosensitive film. The wafer with photoresist film is then exposed to 248 nm DUV radiation from 4 mj to 40 mj dose to generate acid, followed by a 85° C. post bake for 90 seconds. A control wafer may be obtained by treating another wafer using TFA (Sigma-Aldrich).

The deprotection is then monitored by coupling 5,6-carboxyfluorescein to the free surface amine groups. The fluorescein may be purchased from AnaSpec and mixed with polymeric NMP (fluorescein:Boc-Gly-OH, 1:6 in 0.1M solution to avoid quenching) to make a fluorescein coupling mixture. The prepared fluorescein coupling mixture is then spun on the wafer at 1000 rpm for 15 seconds, followed by a post bake for 5 minutes. After removing the coupling mixture, the wafer is washed by 50% EDA (purchased from AnaSpec)/Ethanol (v/v) solution for 30 minutes, followed by an ethanol wash for 30 minutes. The fluorescence scan shows that the deprotection efficiency can reach 99%-100% when a 20 mj/cm2 dose or higher is used.

An array of segment of wild-type of human tumor suppressor protein p53 residues 16-25, Gln-Glu-Thr-Phe-Ser- Asp-Leu-Trp-Lys-Leu is synthesized onto a wafer after deprotection treatments described above. Each amino acid coupling mixture is prepared by dissolving about 0.1M corresponding amino acid, 0.1M HOBt and 0.1M DIEA in a polymeric solution. 0.1M DIC is added to the solution 10 minutes prior to the coupling step. The coupling mixture is then heated at 60° C. for 10 minutes for a preactivation. A fluorescence intensity scan of the p53 residues array shows 98%-100% coupling efficiency.

Another p53 peptide array is synthesized onto a wafer by a method including deprotection and coupling steps but omitting the capping steps between the coupling steps and the deprotection steps of the subsequent cycle. The fluorescence intensity scan shows that a 98%-100% coupling efficiency may be obtained, suggesting that the capping steps may be omitted as the deprotection efficiency and the coupling efficiency are both extremely high.

Example VII

An acid producing deprotecting-coupling film is prepared by dissolving, in PGMEA (purchased from Sumitomo Chemical), 10% polymers of PMMA and PS in a portion of 1:2, 1% Fmoc protected amino acid, DIC (diisopropylcarbodiimide) from Advanced Chemtech, DIEA (propylethylamine) from AnaSpec, 5% ITX (Isopropyl-9H-trioxanthen-9-one) and 5% Iodo PAG (Bis(4-tert-butylphenyl)iodonium triflate). ITX may be obtained from Sigma Aldrich Inc. Iodo PAG is available from Hampford Research Inc.

A base producing deprotecting-coupling film is prepared by dissolving, in PGMEA solvent, 10% the polymers PMMA and PS in a portion of 1:2, 1% t-boc protected amino acid concentration, DIC (diisopropylcarbodiimide), 1.5% 4,4c-trimethylenedipiperidine, 3% 2-nitrobenzyl p-nitrophenylcarbonate and 1% 1-hydroxybenzotriazole hydrate.

20 acid producing deprotecting-coupling mixture are prepared. One for each amino acid. In addition, 20 base producing deprotecting-coupling mixture are prepared. One for each amino acid. Acid or base producing lithography steps are performed in alternative to synthesize the peptides microarray.

First, the acid producing deprotecting-coupling mixture is applied onto a wafer at 2000 rpm for 15 seconds to obtain a uniform film of the acid producing deprotecting-coupling mixture over the wafer. The wafer is then baked on a hot plate at 85° C. for 90 seconds, followed by 60 seconds cool-down to 23° C. After being exposed in a Nikon S203 Scanner at an expose energy of 23 mj/cm$^2$, the wafer is baked at 85° C. for 2 minutes, to simultaneously deprotect the surface amino acid synthesize onto the wafer in the previous cycle, and to couple the amino acid to the same. Next, the deprotecting-coupling film is stripped in TEL coater modules using acetone and IPA, taking about 30 seconds. The wafer can then be coated with a base producing deprotecting-coupling mixture for forming a next amino acid to the surface.

Example VIII

PR2 is a mixture of 2.5% (w/v) polymethylmethacrylate (PMMA, the polymer matrix), 5% (w/v) Isopropyl-9H-thioxanthen-9-one (ITX, the photosensitizer) and 5% (w/v) Bis-(4-t-butylphenyl) iodium triflate (PAG, the photo-acid generator) in 1-methoxy-2-propanol acetate (PGMEA) as the solvent. Note that there is some variation and some tolerance in the exact values.

CRM consists of 2% (w/v) diisopropylcarbodiimide (DIC, an activator), 2% (w/v) N,N-diisopropylethylamine (DIEA, a base) and 1.53% (w/v) hydroxybenzotriazole (HOBt, an activator) as well as ~2-5% (w/v) of a specific amino acid using 1-Methyl-2-Pyrrolidinone (NMP) as the solvent. The exact amount of each amino acid is varied, depending on solubility and ease of coupling, but is generally kept at a level such that in the final solution the amino acid had a concentration of 0.2-0.3M. Note that there is some variation and some tolerance in the exact values.

BRM is an equal volume of acetic anhydride and NMP.

The process begins with an 8 inch silicon wafer with a silicon oxide layer (200 nm) that has had a 200 nm layer of PVD sputtered chrome deposited on it. This can be purchased commercially. Steps 1 through 5 are performed using standard, commercially available materials and systems that are well known to those skilled in the art. In particular, the chrome deposited wafers are coated with commercial KrF laser 248 nm photoresists like UV172 or P5107 or JSR micro photoresist KrF M22Y3 or KrF 146G6, in preparing for chrome etching (step 1). The photoresist is coated using a coater module (TEL ACT8) at 2500 RPM and prebaked at the vendor specified temperatures. In step 2, the photoresist coated wafers are exposed to 248 nm DUV light in an NSR S203 Nikon scanner and a mask that defines a grid pattern as discussed below. Each mask contains the pattern for six separate 1.1×1.1 cm die (see below). The exposed wafer is post baked at vendor specified temperature for a fixed time. In step 3, the post baked wafers are developed in a TEL ACT8 developer module using a commercial developer such as 5R7 developer from Rohm & Hass electronic materials. The developed wafer is then etched in step 4 using CR-14 from Cyantek Corporation or Chromium mask etchant from Trancene Corporation. The remaining photoresist is stripped in step 5 using Nano strip from Cyantek Corporation for more than 24 hours.

The result of step 5 is a silicon wafer with a SiO2 layer covered by a chrome grid. For the results described below, the grid lines are 30 microns on center in both directions and each line is 15 microns wide. The resulting SiO2 exposed regions are therefore 15 microns by 15 microns. Each of these chrome-bounded features is the site of one peptide synthesis. All of the peptides synthesized in each individual feature are identical, but the peptide sequence in each of the different features can be varied at will. Functionally, the wafer is divided into 1.1 cm×1.1 cm repeated regions (1 die or chip). Each of these chips contain 100,000 of the chrome-bounded features described above in a 1.0×1.0 cm area plus some quality control features and alignment features in the remainder of the chip.

Step 6 is the activation of the 5i02 surface for subsequent chemical reactions. 3-aminopropyltriethoxysilane (APTES) is used for surface derivatization. The methods used for this are essentially those described by Möller et al., Nucleic Acids Research 28 20 e91 (2000) and are well known to those skilled in the art. This results in free primary amines covering the exposed SiO2 features. To each free amine is coupled a molecule of polyethyleneglycol modified to have a carboxylic acid on one end and a primary amine on the other. The length of the polyethyleneglycol (PEG) linker can be varied, but is typically 10-40 carbons. In some cases, a glycine is added either to the end of, or in place of, the PEG molecule. Standard coupling procedures are used for this step (well known in solid phase peptide chemistry). If the PEG molecule is the only molecule added, it is protected on the amino terminal end by a tertbutoxycarbonyl (Boc) group. If glycine is used, its primary amine is protected by a Boc group.

In step 7, the wafer is transferred into the TELACT8 developer module and the surface is cleaned by addition of 8 ml of acetone (spinning at 2000 rpm) and then 8 ml of isopropyl alcohol (spinning at 2000 rpm). The PR2 photoresist (defined above) is then applied to the surface (8 ml dispensed at 1 ml/s and spun at 2000 rpm for 20 seconds) resulting in a 200 nm layer. This is heated (prebake) to 85° C. for 90 seconds.

In step 8, the wafer is transferred to the NSR S203 Nikon Scanner and the first mask is used to project a pattern of deep UV light onto the surface prepared in step 7, illuminating certain features where the first amino acid is to be coupled. 20-30 mJ/cm$^2$ of light is used per exposure (23 mJ is a typical energy for this process). The wafer is then heated (postbake) to 85-90° C. for 85-90 seconds.

In step 9, the PR2 photoresist is removed by washing with 8 ml of acetone and then 8 ml of isopropyl alcohol, spinning for 30 seconds as described in step 7.

In step 10, the surface is flushed with 10 ml of NMP (2000 rpm) for 10 seconds and then 10 ml of the chemical reaction mix (CRM defined above) is added and spun at 2000 rpm for 15 seconds.

In step 11, the wafer is heated to 95° C. for 2 minutes during which the coupling reaction takes place and then it is rapidly cooled over 30 seconds to 23° C.

In step 12, the surface is washed with 10 mls of NMP followed by 10 mls of acetone and then 10 mls of isopropyl alcohol, spinning as described in steps 10 and 7, respectively. This step is optional. One can also perform step 13 directly without the intermediate washes.

In step 13, the surface is flushed with 10 mls of NMP as in step 10 and then the blocking reaction mixture (BRM, defined above) is added (6 mls, spun at 2000 rpm for 15 seconds). The wafer is then heated to 75° C. and incubated for 90 seconds while the blocking reaction takes place. It is also possible to skip both steps 12 and 13 if blocking is not necessary in a synthesis.

In step 14, the BRM is removed with 10 mls each of NMP, acetone and isopropyl alcohol as described in step 12.

At this point, the cycle is repeated, with step 15 being identical to step 7 until the final iteration is complete. At completion, deprotection of the final wafer takes place (step 16). The final side-chain deprotection is performed by soaking the entire wafer (in a dish) in a mixture of HBr, acetic acid and trifluoroacetic acid.

Figure 4:
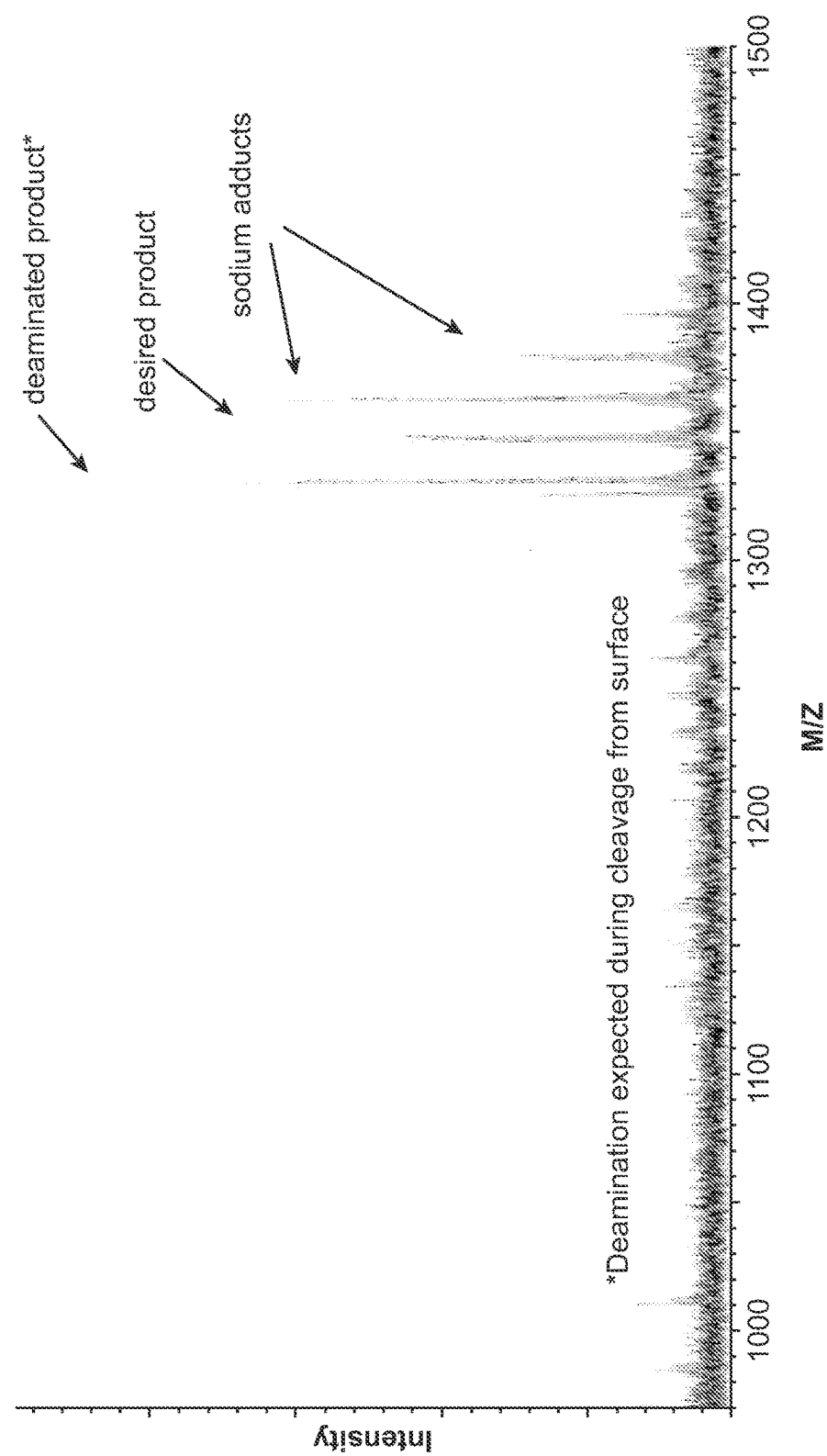
FIG. 4 provides the analysis of the synthesized peptide with the Matrix Assisted Laser Desorption/Ionization time of flight (MALDI-TOF) mass spectrum.

Result 1 synthesizing a single peptide on the wafer. The process described above, or a minor modification of it, is used to create a wafer on which the amino acid sequence N-QETFSDLWKLM-C is synthesized. This same sequence is synthesized at all possible positions on the wafer (i.e., there was only one sequence of peptide synthesized everywhere). The first amino acid attached (the C-terminal amino acid) is methionine. After the peptide had been synthesized across the wafer, it is then treated in bulk with cyanogen bromide resulting in cleavage at the methionine residue, a process that is well known to those skilled in the art. This resulted in a peptide with the Matrix Assisted Laser Desorption/Ionization time of flight (MALDI-TOF) mass spectrum shown in FIG. 4. The methonine is modified during cleavage as shown. The peptide thus obtained is concentrated, soublized and lypholized and then brought up on 100 microliters of acetonitrile/water (50/50). 1 microliter of this solution is mixed with 9 microliters of matrix and spotted on a MALDI-TOF plate. Both the molecular weights of the peptides created and the amino acid sequence of the main peak are determined. There are several species evident (FIG. 4). One is the parent ion with the expected molecular weight of the cleaved peptide (1349). At 17 daltons lower molecular weight is the same species in which the glutamine side chain had been deaminated (a reaction that we have shown happens during the cyanogen bromide cleavage but presumably would not occur when the peptide is simply left on the silicon surface). At 17 daltons above (1366) is that expected position of the hydrolyzed lactone. Each of these peaks represents the correct, full length peptide being synthesized on the surface of the silicon. The fact that there are multiple peaks is an artifact of the cleavage conditions.

Figure 5:
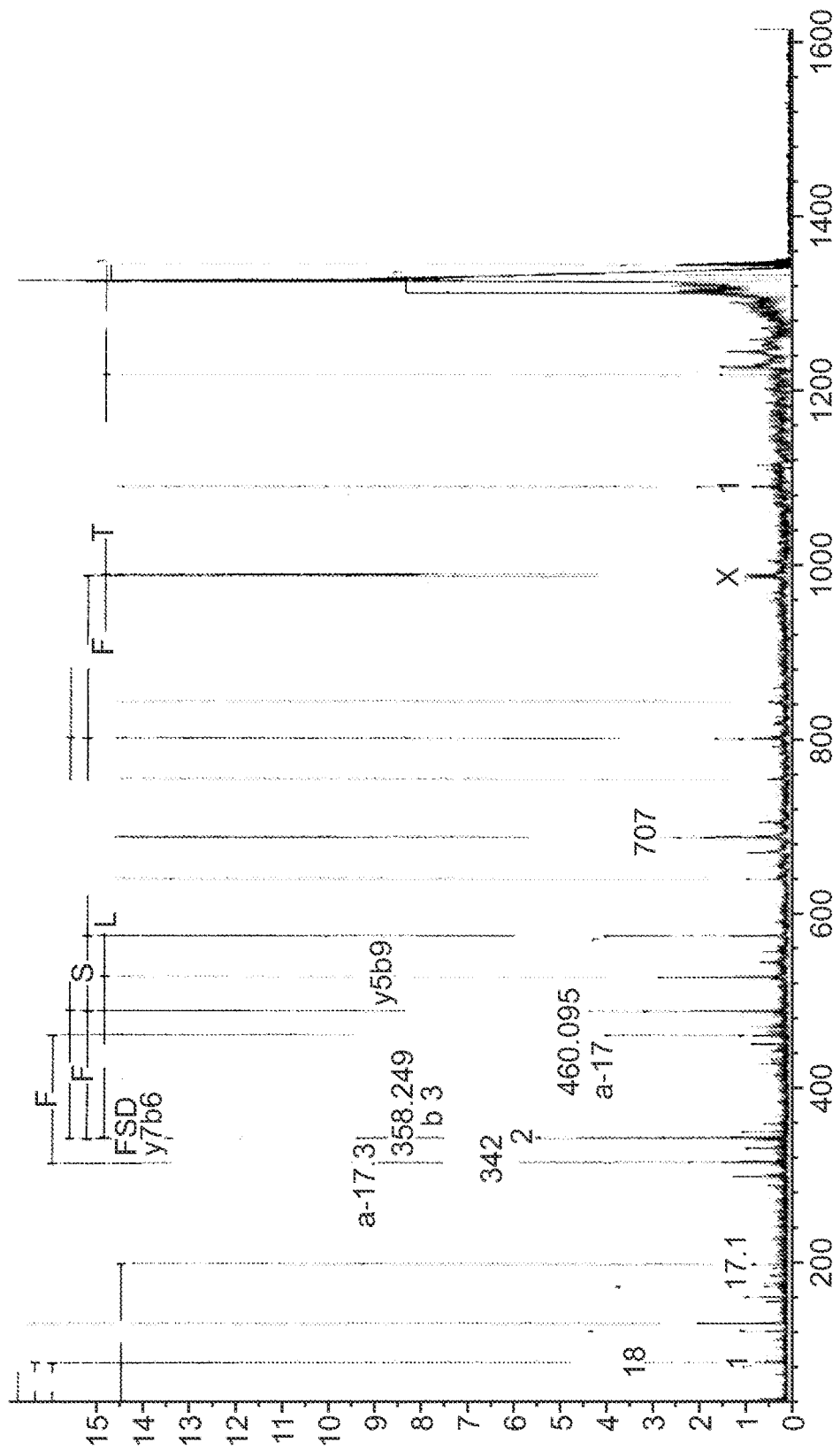
FIG. 5 shows a TOF-TOF spectrum in which the parent ion is fragmented generating ions that differ by one amino acid.

FIG. 5 shows a TOF-TOF spectrum in which the parent ion is fragmented generating ions that differ by one amino acid. This allows one to directly sequence the peptide. As can be seen the peptide sequence is as expected, at least up to the tryptophan.

Result 2: Synthesizing a chip with 100,000 different peptides. A wafer is fabricated that had approximately 100,000 different peptide sequences each of which is 12 amino acids in length and each of the amino acids is one of the following: E F G H K P W Y. These are referred to as 12/8 wafers (12 amino acids long with a composition involving 8 amino acids). A distinct peptide is created at each of the 100,000 positions within the 1.1×1.1 cm chip. The sequences of the peptides at each position are chosen randomly.

The fidelity of the synthesis is determined statistically. From other experiments, in which particular antibodies or other proteins are bound to an array of 10,000 spotted peptides on a glass slide, we know that certain proteins tend to bind peptides rich in one particular amino acid or another or they tend not to bind peptides rich in some particular amino acid. In fact, there is a clear correlation between the number of a particular type of amino acid in the peptide sequence and the binding of a particular protein (including particular antibodies).

Figure 6:
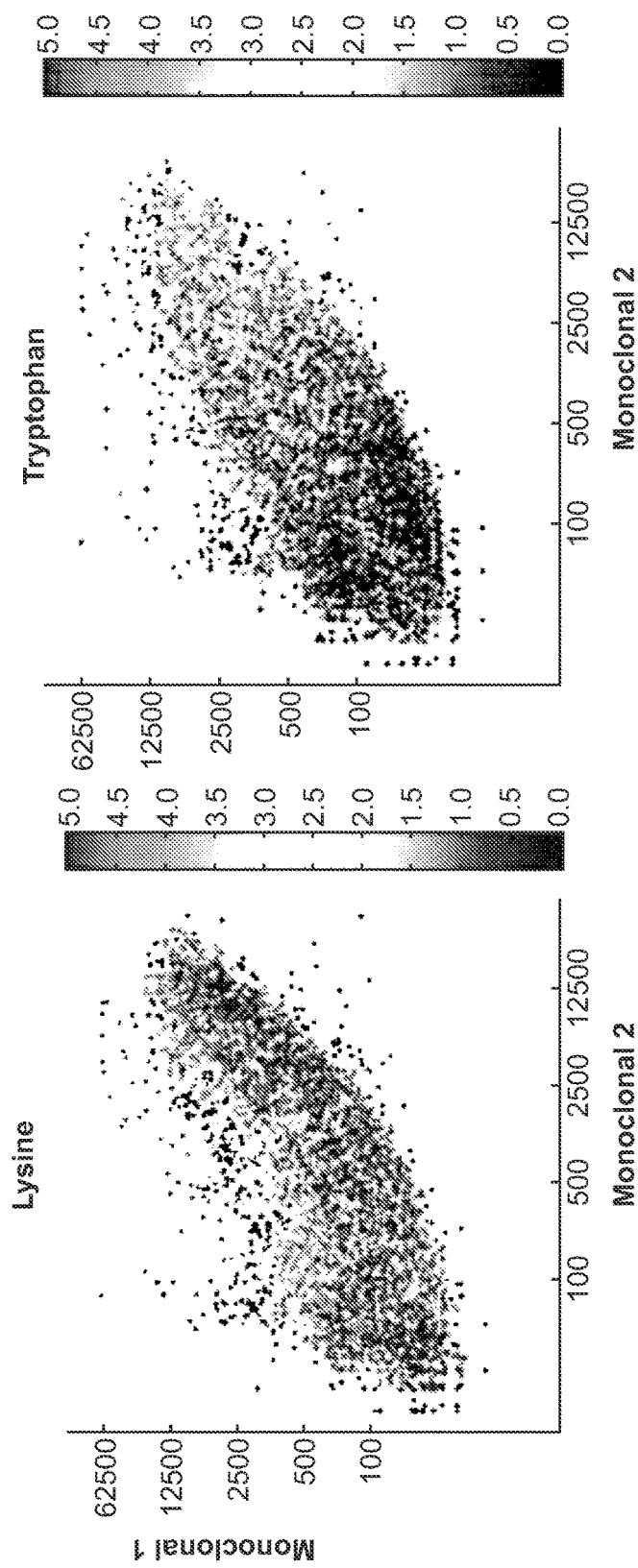
FIG. 6 shows the relative binding of two different monoclonal antibodies. The Y-axis represents the binding strength for a particular feature in the peptide array to the monoclonal antibody "anti-P53" and the X-axis represents the binding strength for each spot on the array to the antibody "Invitrogen mAB".

The results of these experiments are shown in FIG. 6. Here a comparison of binding results between two different monoclonal antibodies is presented. The Y-axis represents the binding strength for a particular feature in the peptide array to the monoclonal antibody "anti-P53" and the X-axis represents the binding strength for each spot on the array to the antibody "Invitrogen mAB". There is a very nonrandom dependence of binding on the number of particular amino acids in the peptide (the number of a particular amino acid is given by the color, with red being more of that amino acid per peptide). The peptides expected to have a large number of lysines, for example (see the red dots in the panel marked "K") all tend to cluster in a certain region of the plot. By comparing this analysis to a very similar analysis done for peptides that are spotted, it is clear that the expected pattern is observed. This is very strong evidence that the amino acid composition from spot to spot is varying in the manner expected.

Figure 7:
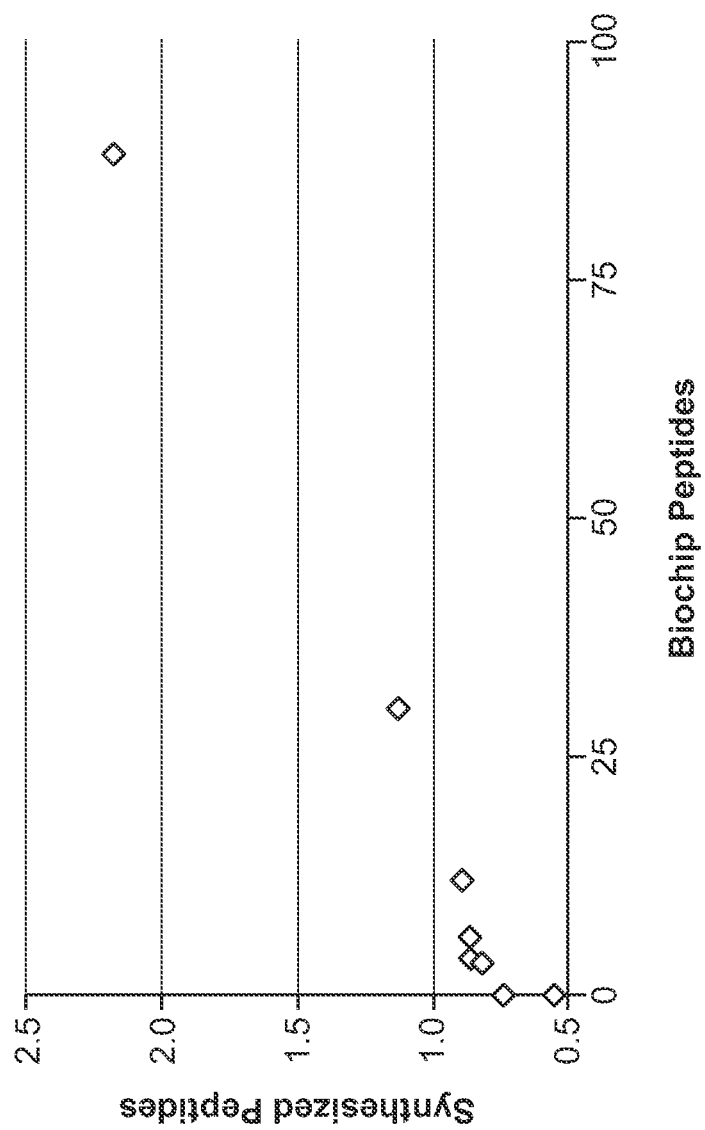
FIG. 7 shows a comparison between binding intensities for a small set of peptides that were both present on the biochip and independently synthesized and bound to a surface. One can see that there was a good correlation between the binding intensities suggesting that indeed the peptides synthesized commercially and those synthesized on the chip were the same.

It is also possible to compare the binding of a monoclonal antibody with certain peptides on the 100,000 peptide array created as described above, to the binding of that antibody to peptides synthesized commercially that are designed to have the same sequences as the specific peptides in the array. FIG. 7 shows a comparison of binding intensities of peptides on the array vs. peptides that are synthesized commercially. Each spot represents the average of binding from several different peptides with similar binding affinities on the 100,000 peptide array. Note that there is a strong correlation between the binding of the peptides on the array and the binding of peptides synthesized such that they are known to have the sequences that the peptides at those positions on the array are designed to have. Again, this is very strong evidence that the sequence of the peptides on the array corresponds to the expected sequence.

Figure 8:
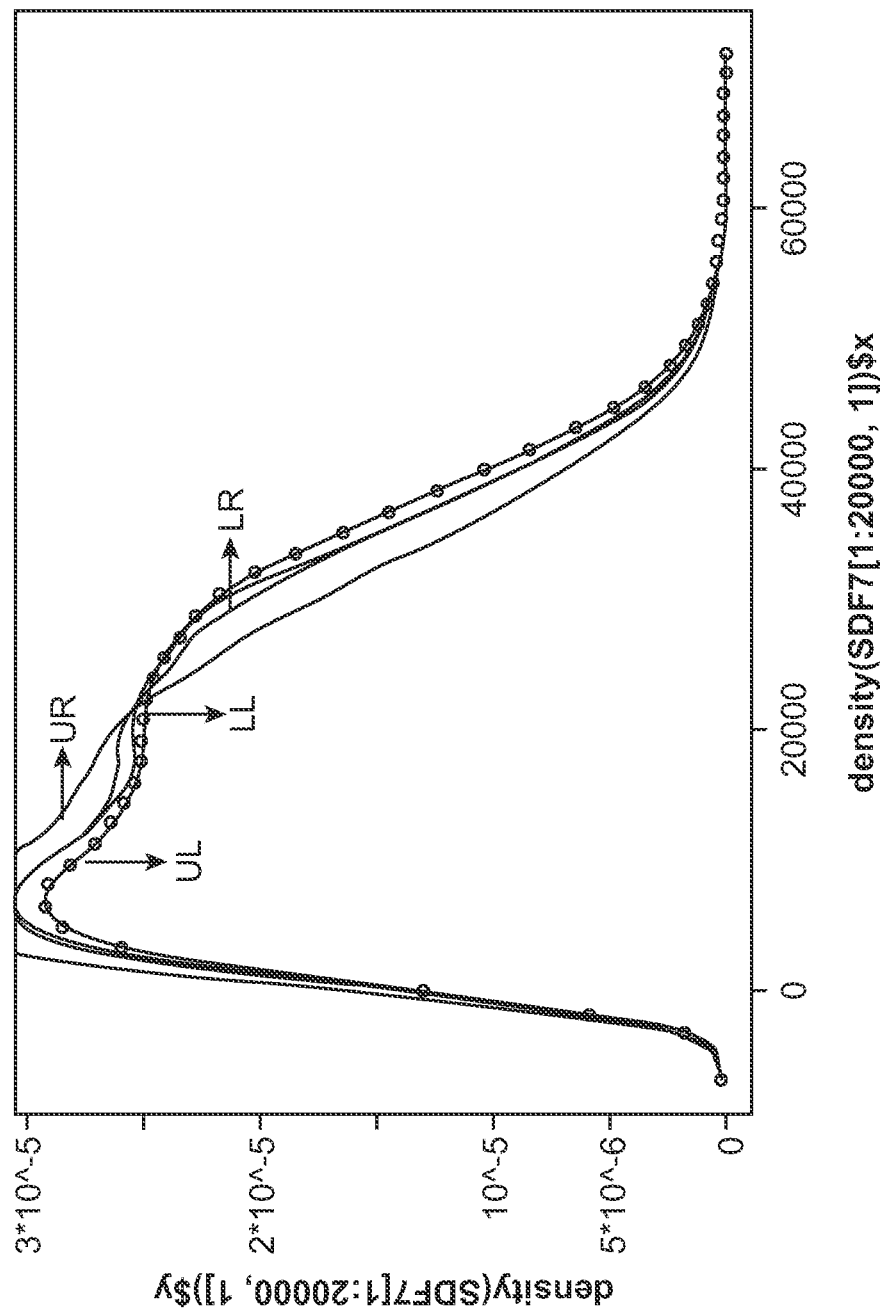
FIG. 8 shows the binding distribution in the four quadrants (UR=upper right, UL=upper left, LL=lower left, LR=lower right) of a biochip with 100,000 peptides in roughly one square centimeter. Using the Kolmogorov-schmirnov goodness of fit test, a p value of >0.00001 is obtained, indicating that the densities are identical. This means the data densities from each corner is common.

In addition, the overall evenness of the peptide features on the arrays is very good. This can be seen by the distribution of binding over a large enough region of the chip so that the average of the subset is representative of the total. This is shown in FIG. 8. In this case, distributions of binding intensities in the four quadrants of the chip are shown. They are nearly identical.

Example IX

Figure 9A:
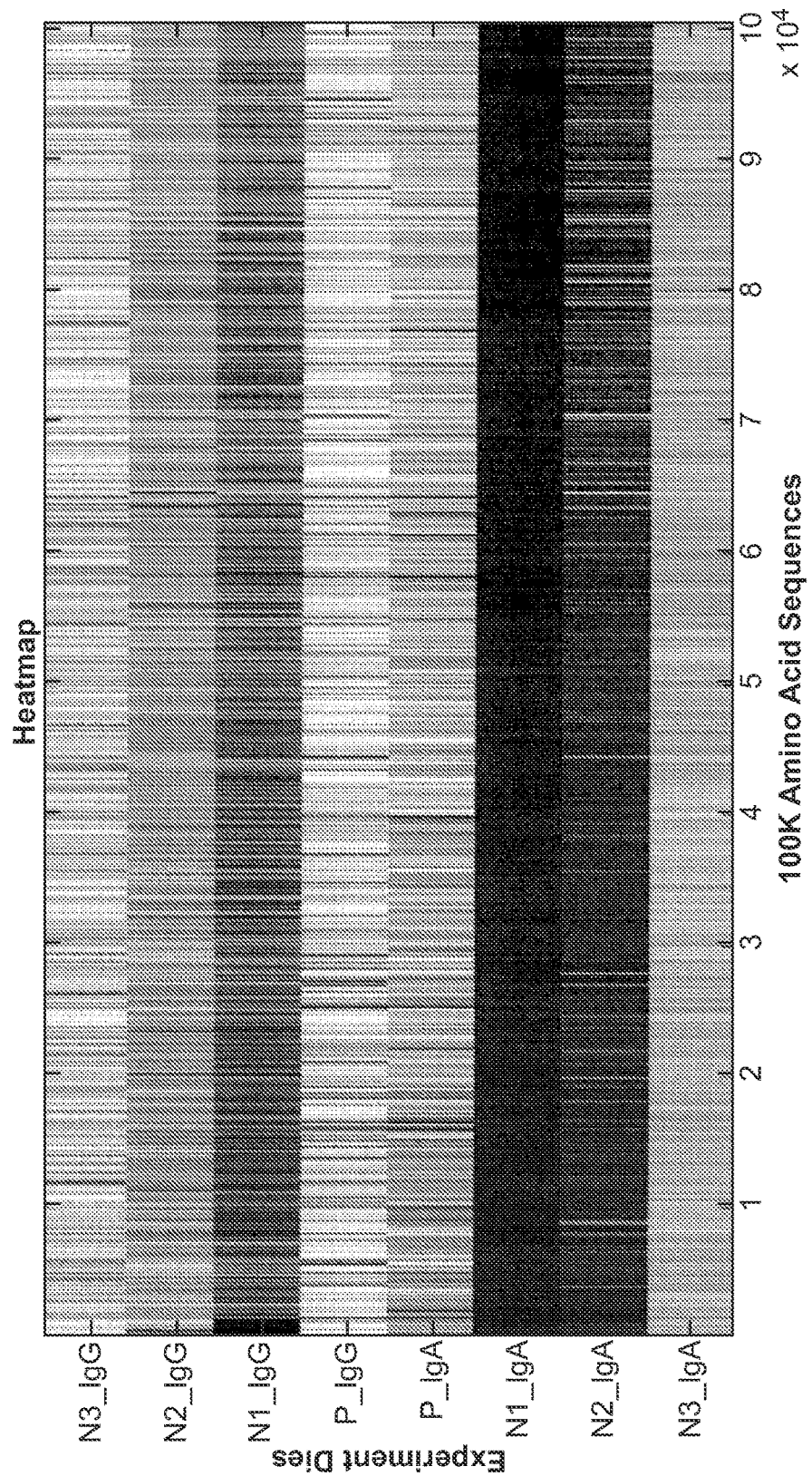
FIGS. 9 A-C shows an analysis of a peptide assay of IgA and IgG (9A) using three color flourescein secondary antibodies.
Figure 9B:
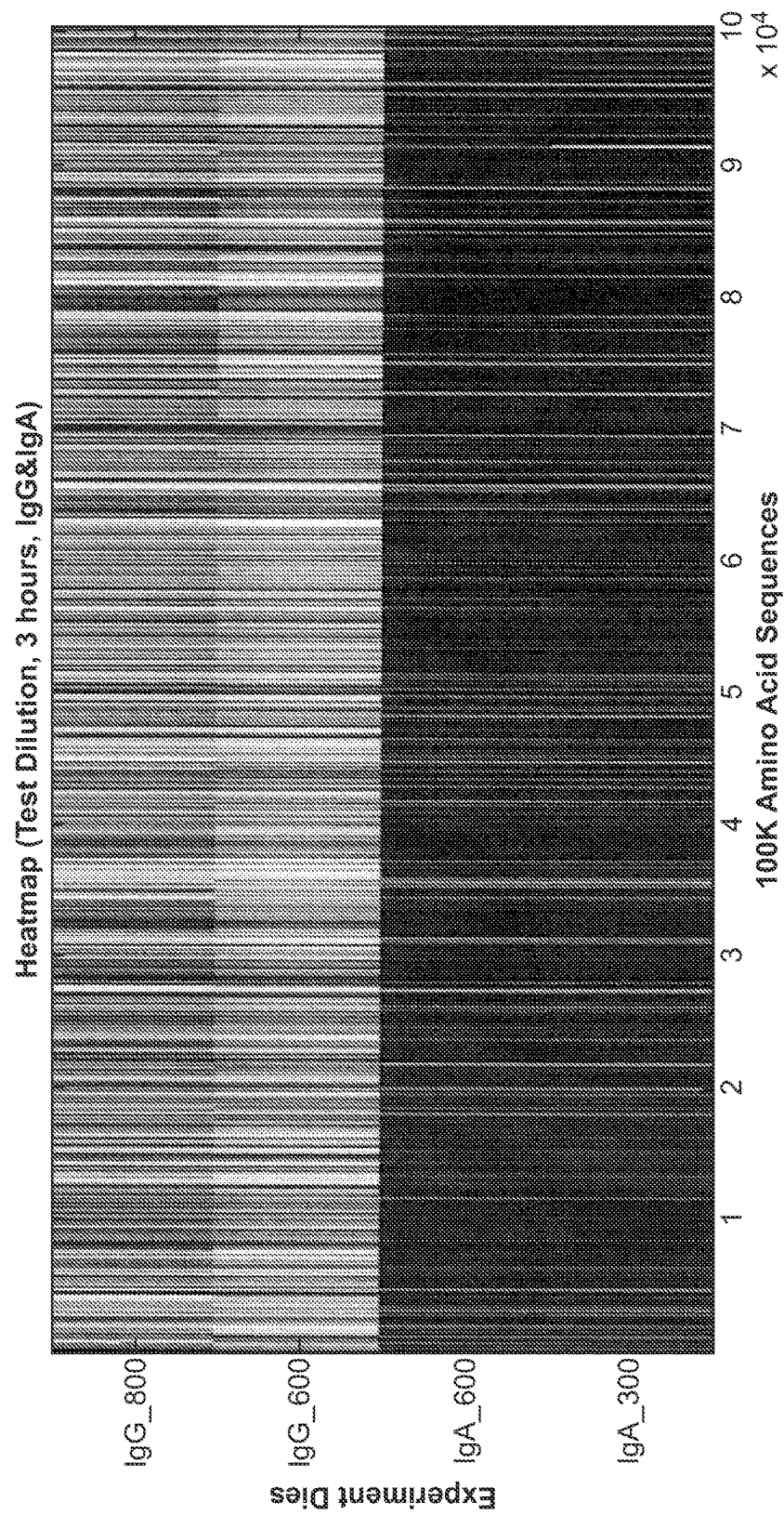
Figure 9C:
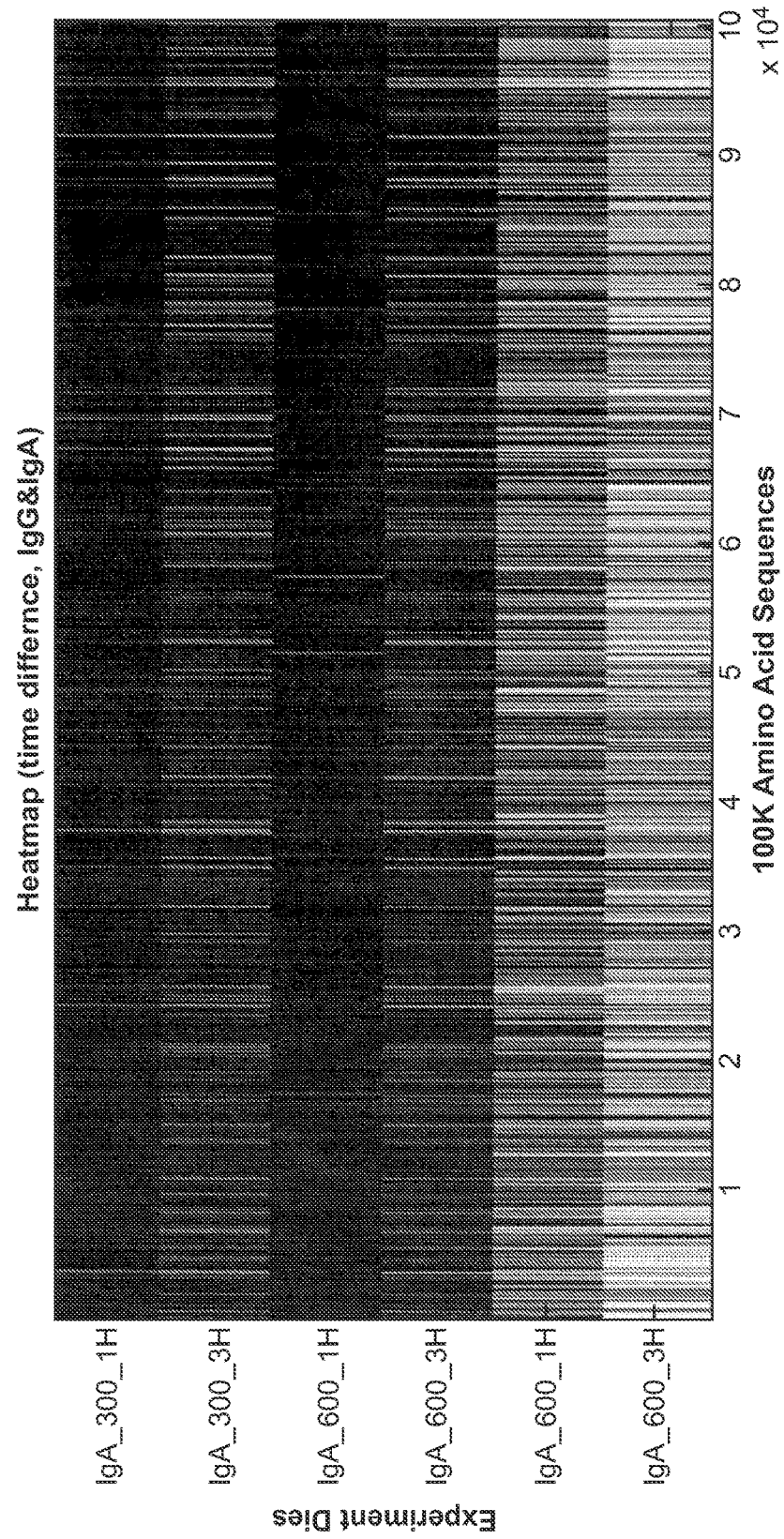

When running an assay of serum from patients having Celiac disease, it was found that IgA and IgM are a class of antibodies that played major role in diagnostics and in evaluating serum. In this example, a peptide array, on which features of IgM and IgA and IgG are synthesized, is prepared for performing serum assay. The peptide assay of IgA, IgM and IgG is then assessed by using three color flourescein secondary antibodies, as shown in FIGS. 9 A-C. FIG. 9 A compares the results as a heatmap for IgG and IgA binding. In this heat map, stronger binding to a particular peptide is indicated by the color of the bar representing that peptide (the 100,000 peptide binding results are shown along the x-axis). Red is strong binding, blue is weak binding. FIG. 9B demonstrates the effects of diluting the sample. FIG. 9C shows the effects on the heatmap of different incubation times. Such a comparative measurement of IgA, IgM and IgG binding may enhance the diagnostic value of the assay. In addition, the different isotypes of immune globins appear at different points in the manifestation of the immune response, potentially providing additional information of diagnostic value.

Multiple isotypes of antibodies in serum may be used to assess vaccine response and efficacy, vaccine development, personalized vaccine, personalized diagnosis, and personalized medicine using an array of more than 1 million peptides.

The foregoing examples are not limiting and are merely illustrative of various aspects and embodiments of the present invention. All documents cited herein are indicative of the levels of skill in the art to which the invention pertains. None, however, is admitted to be prior art.

One skilled in the art will readily appreciate that the present invention is well adapted to carry out the objects and obtain the ends and advantages mentioned, as well as those inherent therein. The methods and compositions described illustrate preferred embodiments, are exemplary, and are not intended as limitations on the scope of the invention. Certain modifications and other uses will occur to those skilled in the art, and are encompassed within the spirit of the invention, as defined by the scope of the claims.

The invention illustratively described herein suitably may be practiced in the absence of any element or elements, limitation or limitations which is not specifically disclosed herein. The terms and expressions which have been employed are used as terms of description and not of limitation, and there is no intention in the use of such terms and expressions of excluding any equivalents of the features shown and described, or portions thereof. It is recognized that various modifications are possible within the scope of the invention claimed. Thus, it should be understood that although the present invention has been specifically disclosed by preferred embodiments, optional features, modifications and variations of the concepts herein disclosed may be resorted to by those skilled in the art, and that such modifications and variations are considered to be within the scope of this invention as defined by the description and the appended claims.

In addition, where features or aspects of the invention are described in terms of Markush groups or other grouping of alternatives, e.g., genuses, those skilled in the art will recognize that the invention is also thereby described in terms of any individual member or subgroup of members of the Markush group or subgenus, and exclusions of individual members as appropriate, e.g., by proviso.

Other embodiments are within the following claims.

What is claimed is:

1. A method of making an array of molecules, comprising:
providing a substrate having a surface wherein the surface has a plurality of features, each of the features being defined and outlined by an electrically neutral perimeter wall to reduce lateral diffusion of reagents and at least some of the features comprising a first plurality of active sites, wherein the electrically neutral perimeter wall comprises a metal chosen from the group consisting of gold, chrome and tin, and wherein the surface of the feature comprises a different material than the electrically neutral perimeter wall,
applying a first chemical reaction mixture onto the surface such that the first chemical reaction mixture is evenly distributed across the first plurality of active sites, wherein the first chemical reaction mixture comprises a first molecule having a first functional group capable of attaching to the active site, a second functional group capable of forming a covalent bond and a protecting group capping the second functional group, whereby the first molecule is coupled to the first plurality of active sites.

2. The method of claim 1 further comprising
selectively forming a second plurality of active sites in at least some of the features,
applying a second chemical reaction mixture onto the surface such that the second chemical reaction mixture is evenly distributed across the second plurality of active sites, wherein the second chemical reaction mixture comprises a second molecule having a first functional group capable of attaching to the active site, a second functional group capable of forming a covalent bond and a protecting group capping the second functional group, whereby the second molecule is coupled to the second plurality of active sites.

3. The method of claim 1, wherein after the first chemical reaction mixture is applied onto the surface, the method further comprises heating the substrate.

4. The method of claim 3, wherein the heating the substrate comprises heating the substrate with a hot plate.

5. The method of claim 2, wherein selectively forming a second plurality of active sites in at least some of the features comprises
depositing a photosensitive layer over the substrate wherein the photosensitive layer comprises a deprotecting reagent precursor that upon activation generates a deprotecting reagent capable of causing the removal of the protecting group,
activating at least a portion of the photosensitive layer; and
removing the photosensitive layer.

6. The method of claim 5, wherein activating at least a portion of the photosensitive layer comprises exposing at least a portion of the photosensitive layer to radiation.

7. The method of claim 1 wherein the electrically neutral perimeter wall is formed by a process comprising,
   depositing a metal film onto a surface of a substrate;
   forming a patterned photosensitive layer on the metal film;
   etching the metal film in areas not covered by the photosensitive layer to form the plurality of features that are defined by the electrically neutral perimeter wall; and
   removing the patterned photosensitive layer.

8. The method of claim 7, wherein prior to depositing the metal film onto the surface of the substrate, the substrate has a thermal oxide film on the surface.

9. The method of claim 7, wherein prior to depositing the metal film on the surface of the substrate, the substrate has a thermal oxide film, wherein the substrate is a wafer and the thermal oxide film is on both sides of the wafer.

10. The method of claim 1, wherein the electrically neutral perimeter wall comprises a series of pillars or a series of particles.

11. The method of claim 1, wherein the electrically neutral perimeter wall comprises a molecule having an affinity for the first chemical reaction mixture.

12. The method of claim 1, wherein the first chemical reaction mixture further comprises a polymer matrix.

13. The method of claim 12, wherein the polymer matrix comprises at least one polymer selected from poly(methyl methacrylate), polystyrene, polycarbonate, polyethylene glycol, and poly(choloromethyl methacrylate).

14. The method of claim 1, wherein the first molecule is an amino acid having an amino group that is optionally capped with a protecting group, wherein the protecting group is a fluorenylmethyloxycarbonyl group, a t-butoxycarbonyl group or an optionally substituted trityl group capping the amino group.

15. The method of claim 1, wherein the first chemical reaction mixture further comprises a solvent.

16. The method of claim 15, wherein the solvent is N-methyl-2-pyrrolidone.

17. The method of claim 1, wherein the first chemical reaction mixture further comprises DIC, a base chosen from DIEA and 4,4'-trimethylenedipiperidine, isopropyl-9H-trioxanthen-9-one, bis(4-tert-butylphenyl)iodonium triflate or 2-nitrobenzyl p-nitrophenylcarbonate or 1-hydroxybenzotriazole hydrate.

18. The method of claim 1, wherein the first molecule is a nucleotide.

19. The method of claim 18, wherein the first molecule is a nucleotide having a dimethoxy trityl group capping the second functional group.

20. The method of claim 18, wherein the first chemical reaction mixture further comprises a polymer matrix, wherein the polymer matrix comprises poly(methyl methacrylate), polystyrene, polycarbonate or polyethylene glycol.

21. The method of claim 1, wherein the array of molecules is chosen from the consisting of peptides, oligonucleotides, polyamide polynucleotide (PNA), deoxyribopolynucleotide (DNA), ribopolynucleotide (RNA), DNA copies of deoxyribopolynucleotide (cDNA) and combinations thereof.

* * * * *